US007087362B2

(12) United States Patent
Shimada et al.

(10) Patent No.: US 7,087,362 B2
(45) Date of Patent: Aug. 8, 2006

(54) HEAT MODE-COMPATIBLE PLANOGRAPHIC PRINTING PLATE

(75) Inventors: Kazuto Shimada, Shizuoka-ken (JP); Kazuto Kunita, Shizuoka-ken (JP); Ippei Nakamura, Shizuoka-ken (JP); Ikuo Kawauchi, Shizuoka-ken (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 3 days.

(21) Appl. No.: 10/733,262

(22) Filed: Dec. 12, 2003

(65) Prior Publication Data

US 2004/0121263 A1 Jun. 24, 2004

Related U.S. Application Data

(62) Division of application No. 09/793,760, filed on Feb. 27, 2001, now Pat. No. 6,692,896.

(30) Foreign Application Priority Data

Mar. 1, 2000 (JP) ............................ 2000-055772
Mar. 9, 2000 (JP) ............................ 2000-065162

(51) Int. Cl.
*G03F 7/04* (2006.01)

(52) U.S. Cl. .............................. 430/281.1; 430/270.1; 430/302

(58) Field of Classification Search ............ 430/270.1, 430/281.1, 286.1, 288.1, 302
See application file for complete search history.

(56) References Cited

U.S. PATENT DOCUMENTS

| | | | | |
|---|---|---|---|---|
| 5,721,288 | A | 2/1998 | Aotani et al. | |
| 5,807,659 | A | 9/1998 | Nishimiya et al. | |
| 5,989,781 | A | 11/1999 | Idacavage et al. | |
| 6,132,929 | A * | 10/2000 | Nakamura et al. | 430/270.1 |
| 6,153,356 | A | 11/2000 | Urano et al. | |
| 6,153,660 | A | 11/2000 | Fujimaki et al. | |
| 6,200,727 | B1 | 3/2001 | Urano et al. | |
| 6,232,038 | B1 | 5/2001 | Takasaki et al. | |
| 6,251,559 | B1 | 6/2001 | Huang et al. | |
| 6,340,551 | B1 | 1/2002 | Miyake et al. | |
| 6,410,207 | B1 | 6/2002 | Nagasaka et al. | |
| 6,461,795 | B1 | 10/2002 | McCullough et al. | |

FOREIGN PATENT DOCUMENTS

| | | | |
|---|---|---|---|
| EP | 0909657 | A2 | 4/1999 |
| JP | 11-7125 | A | 1/1999 |
| WO | WO99/11458 | A1 | 3/1999 |

* cited by examiner

*Primary Examiner*—Barbara L. Gilliam
(74) *Attorney, Agent, or Firm*—Buchanan Ingersoll PC

(57) ABSTRACT

A process for producing a heat mode-compatible positive planographic printing plate precursor comprising a support and a photosensitive layer whose solubility in an aqueous alkali solution increases upon heat-mode exposure, which includes: applying a photosensitive layer coating solution onto the support, and drying the photosensitive layer coating solution at a drying temperature not less than 150° C. and not greater than 200° C. and for a drying time of 110 seconds or less.

14 Claims, No Drawings

HEAT MODE-COMPATIBLE PLANOGRAPHIC PRINTING PLATE

This application is a divisional of application Ser. No. 09/793,760, filed on Feb. 27, 2001, now U.S. Pat. No. 6,692,896, the entire contents of which are incorporated by reference herein.

BACKGROUND OF THE INVENTION

1. Field of the Invention

The present invention relates to a planographic printing plate that can be written with an infrared laser and has a highly sensitive negative photosensitive layer, and to a positive planographic printing plate that can be written by heat from an infrared laser, a thermal head or the like, particularly a positive planographic printing plate for so-called direct plate formation in which a plate can be formed directly by scanning an infrared laser based on digital signals from a computer or the like.

2. Description of the Invention

The development of lasers in recent years has been remarkable. In particular, high-output, compact solid-state lasers and semiconductor lasers having an emission range in the near infrared to infrared range are being developed. Accordingly, these lasers are extremely useful as an exposure light source at the time a printing plate is formed directly on the basis of digital data from a computer or the like.

A negative planographic printing plate material for an infrared laser, which negative planographic printing plate material uses as an exposure source an infrared laser having an emission range in the infrared range is a planographic printing plate material having a photosensitive layer containing an IR absorber, a polymerization initiator generating radicals by light or heat, and a polymerizable compound.

Usually, such a negative image-recording material utilizes a recording system where radicals generated by light or heat are used as the initiator to generate a polymerization reaction for hardening the photosensitive layer of exposed portions to form an image portion. Because this negative image-forming material is inferior in image formability when compared to the positive which causes dissolution of the photosensitive layer by the exposure energy of an infrared laser, heat treatment is generally conducted before the development step in order to promote a hardening reaction by polymerization thereby forming a strong image portion.

As a printing plate having a photosensitive layer polymerizable by light or heat, techniques are known in which a light-polymerizable or heat-polymerizable composition is used as a photosensitive layer, as disclosed in Japanese Patent Application Laid-Open (JP-A) No. 8-108621. In preparing a planographic printing plate using such an image recording material, however, there is the problem that as described in said publication, stable and highly sensitive images cannot be obtained without conducting pre-heating and post-heat treatment in order to stabilize the images. This is possibly because not all energy from an infrared laser for recording is used for decomposition of the polymerization initiator, thus lowering the efficiency of decomposition.

On the other hand, a positive planographic printing plate material for infrared lasers for direct plate making is disclosed in JP-A No. 7-285275. This prior art invention relates to an image-recording material comprising a material generating heat upon absorption of light and a positive photosensitive compound such as quinonediazide etc. added to a resin soluble in an aqueous alkali solution, wherein the positive photosensitive compound acts, in the image portion, as a dissolution inhibitor for substantially lowering the solubility of the resin soluble in an aqueous alkali solution, while in the non-image portion, the positive photosensitive compound is decomposed by heat and removed by development thus preventing it from exhibiting the dissolution-inhibiting properties and images are thereby formed.

As a result of investigation, the present inventors found that positive images can be obtained even if the quinonediazide or the like is not added to the image recording material, but there is the problem that the image-recording material to which the quinonediazide or the like is not added the stability of sensitivity with respect to the concentration of a developing solution, that is the development latitude, is poor. The development latitude refers to an allowable range in which good images can be formed when the alkali concentration in an alkali developing solution is changed.

On the other hand, onium salts or alkali-insoluble compounds capable of hydrogen bonding are known to have an alkali dissolution-inhibiting action on resins soluble in an aqueous alkali solution. WO 97/39894 describes a infrared laser-compatible image-forming material in which a composition which uses a cationic, infrared absorbing dye as dissolution inhibitor of a resin soluble in an aqueous alkali solution, behaves like a positive. This behavior is one in which the infrared absorbing dye absorbs laser rays to generate heat thereby eliminating the effect of inhibiting the dissolution of a polymeric film on the exposed portion, and thereby carrying out image formation.

In these positive image-forming materials, the interaction among polymers constituting the photosensitive layer is eliminated by exposure for image formation, and thus control of interaction among the polymers is important. In the planographic printing plate provided with such a heat mode-compatible photosensitive layer, however, there is the problem that the interaction among the polymers is varied with time, and the coating properties of the photosensitive layer are lowered and the image forming properties vary.

SUMMARY OF THE INVENTION

An object of the present invention is to provide a planographic printing plate having a highly sensitive negative photosensitive layer capable of being written with an infrared laser. Another object of the present invention is to provide a positive planographic printing plate excellent in image-forming properties and superior in storage stability in that the coating properties and image-forming properties of a photosensitive layer are not lowered even after long-term storage.

By paying attention to the residual solvent in the negative image-recording material, the present inventors found that if the residual solvent is present in a large amount in the photosensitive layer, the heat energy from the infrared laser is used for gasification of the solvent, resulting in a reduction in the efficiency of decomposition of the polymerization initiator, and also that the sensitivity can be improved by regulating the amount of the residual solvent. Further, by directing attention to the residual solvent in the positive image-recording material, the present inventors found that the solvent used in forming the photosensitive layer has the function of inhibiting the interaction among polymers in the photosensitive layer, and that the reduction in image forming properties can be prevented by regulating the amount of the solvent in the photosensitive layer which is formed.

The objects described above are achieved by the means described below.

The first aspect of the present invention is a heat mode-compatible planographic printing plate comprising a photosensitive layer which is capable of recording with an infrared laser and formed by applying a photosensitive layer coating solution onto a hydrophilic support and then drying the photosensitive layer coating solution, said photosensitive layer coating solution being prepared by dissolving or dispersing I) an IR absorber, II) a polymerization initiator, and III) a compound having a polymerizable unsaturated group in a solvent, wherein the residual solvent in the photosensitive layer is 5% by weight or less relative to the weight of the photosensitive layer.

The second aspect of the present invention is a heat mode-compatible positive planographic printing plate comprising a photosensitive layer whose solubility in an aqueous alkali solution increases upon heat-mode exposure and which is formed by applying a photosensitive layer coating solution onto a support and then drying the photosensitive layer coating solution, said photosensitive layer coating solution being prepared by dissolving or dispersing a photosensitive composition in a solvent, said photosensitive composition contains a polymer insoluble in water but soluble in an aqueous alkali solution, wherein the residual solvent in the photosensitive layer is 5% by weight or less relative to the weight of the photosensitive layer.

The solvent used for coating the photosensitive layer has a sufficient interactive ability to dissolve components such as polymers etc. in the photosensitive layer, so that the solvent remaining after formation of the coating interacts with, as well as competes with the interaction between the polymers as well as that between the polymers and the IR absorber, thus inhibiting the desired interaction between the polymers as well as that between the polymers and the IR absorber. During long-term storage, the residual solvent can gradually volatilize from the photosensitive layer, and "as the volatilization proceeds, the interaction between the polymers and between the polymers and the IR absorber can be varied.

Although the action of the present invention is not clear, it is considered to be achieved in the following way. The amount of the residual solvent in the photosensitive layer, which was used for preparation of the photosensitive layer coating solution, is limited to a predetermined amount so that the influence of the solvent on the interaction between the polymers and that between the polymers and the IR absorber is suppressed, whereby the ability of the photosensitive layer to prevent dissolution during long-term storage is not varied, thus preventing the deterioration of image forming properties after long-term storage.

DESCRIPTION OF THE PREFERRED EMBODIMENTS

First, the phrase "heat mode-compatible" in the present invention will be described. In the present invention, "heat mode-compatible" means that recording by heat mode exposure is feasible. Now, the definition of heat mode exposure will be described in detail. As described in Hans-Joachim Timpe, IS&Ts NIP 15:1999 International Conference on Digital Printing Technologies, p. 209, it is known that there are roughly two modes in which a light absorbing material for forming an image (e.g. a pigment) in a photosensitive material is subjected to light excitation, via chemical or physical change. One mode is the so-called photon mode in which the optically excited light-absorbing material is inactivated by some opticochemical interactions (e.g., energy transfer and electron transfer) with other reactive materials in the photosensitive material, and the reactive materials thus activated cause chemical or physical change necessary for formation of images. The other mode is the so-called heat mode in which the optically excited light-absorbing material is inactivated by generating heat and by this heat, other reactive materials cause chemical or physical change necessary for formation of images. Besides these modes, there are special modes such as abrasion wherein the materials explosively scatter due to topically collected light energy, and a mode in which a large number of photons are absorbed all at once, but the description of such modes is omitted in this specification.

The exposure processes utilizing the modes described above are called photon-mode exposure and heat-mode exposure. The technical difference between photon-mode exposure and heat mode exposure is whether or not the amount of energy of each exposed photon can be added up in order to initiate the desired reaction. For example, let us suppose that photons whose number is "n" are utilized to initiate a certain reaction. Because photochemical interaction is utilized in the photon-mode exposure, the energy of each photon cannot be added up so as to initiate the reaction because of the rule for conservation of quantum energy and momentum. To cause a certain reaction, therefore, the relationship "energy of one photon≧energy of the reaction" should be satisfied. In the heat-mode exposure, however, light excitation is followed by generation of heat so that because the heat thus converted from the light energy is utilized, the energy of each photon can be added up and thus initiate the reaction. Accordingly, the reaction can be initiated by satisfying the relationship "energy of photons whose number is "n"≧energy of the reaction". However, this addition of energy is limited by heat diffusion. That is, if the next light excitation-inactivation reaction occurs to generate heat before the previously generated heat is lost by heat diffusion from the exposed portion (reaction site), the heat is certainly accumulated and added up to thus raise the temperature of that portion. However, if the next generation of heat is delayed, the heat is lost and not accumulated. That is, in the heat-mode exposure, the accumulated energy which result from exposure with high-energy rays for a short time is different from that from exposure with low-energy rays for a long time although the total energy of exposure in both cases is the same, and the latter case is advantageous for the accumulation of heat.

As a matter of course, a similar phenomenon may occur in the photon-mode exposure due to the effect of diffusion of the subsequently generated reaction species, though this generally does not occur in the photon-mode exposure.

That is, from the standpoint of the characteristics of the photosensitive material, the inherent sensitivity (energy for the reaction necessary for formation of images) of the photosensitive material in the photon mode is constant regardless of the exposure power density ($w/cm^2$) (=energy density per unit time), but the inherent sensitivity of the photosensitive material in the heat mode is increased in proportion to the exposure density. Accordingly, if the image-recording material is exposed for a predetermined time which, from a practical perspective, is necessary to maintain productivity, sensitivity as high as about 0.1 $mJ/cm^2$ can be achieved in the photon mode exposure, but the reaction can occur at very low exposure, thus easily causing low-exposure fogging on non-exposed portions. In the heat-mode exposure, however, the reaction does not occur unless the exposure amount is above a predetermined level, so that the problem of low-exposure fogging can be prevented although about 50 $mJ/cm^2$ is usually necessary in respect of the thermal stability of the photosensitive material.

In fact, the exposure density of the plate surface photosensitive material in the heat-mode exposure should be 5000 $w/cm^2$ or more and preferably 10000 $w/cm^2$ or more. However, utilization of a high-power laser with a density of $5.0\times10^5/cm^2$ or more, which has not been described in detail, is not preferable because of problems such as abrasion, pollution of the light source, etc.

It is considered that in the first aspect of the present invention, for example, the residual solvent in the photosensitive layer is limited to a predetermined amount so that by exposure with an infrared laser, the IR absorber converts the light into heat, and the polymerization initiator e.g. an acid generator a radical generator or the like is decomposed by this heat to generate initiation species. At this time the heat is not used for gasification of the solvent and can be used efficiently for decomposition of the polymerization initiator, thus improving sensitivity.

Hereinafter, the first aspect of the present invention is described in detail.

The photosensitive layer of the planographic printing plate in the first aspect of the present invention comprises I) an IR absorber, II) a heat polymerization initiator, and III) a compound having a polymerizable unsaturated group, and when the photosensitive layer is formed, a photosensitive layer coating solution obtained by dissolving or dispersing these components in a solvent is applied onto a support and dried wherein the residual solvent in the photosensitive layer after formation of the layer should be 5% by weight or less relative to the total weight of the photosensitive layer.

The content of the residual solvent in the photosensitive layer is preferably 4% by weight or less and more preferably 3% by weight or less.

In the negative photosensitive layer capable being written with an infrared laser as described above in the prior art, the amount of the residual solvent is usually about 7 to 12%, but in the present invention, the amount of the residual solvent is regulated in the above-described range by e.g. using a low-boiling solvent as the solvent used in preparing the photosensitive layer coating solution, or by regulating drying conditions after application of the photosensitive layer coating solution.

The photosensitive layer in the planographic printing plate in the first aspect is formed by applying a photosensitive layer coating solution onto a hydrophilic support and then drying it, said photosensitive layer coating solution being prepared by dissolving or dispersing I) an IR absorber, II) a heat polymerization initiator, III) a compound having a polymerizable unsaturated group, and other arbitrary components, in a suitable coating solvent.

The solvent used in the photosensitive layer coating solution in the first aspect of the present invention includes organic solvents such as acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethyl formamide, dimethyl sulfoxide, γ-butyrolactone, methyl lactate and ethyl lactate. These can be used singly or in combination thereof.

From the viewpoint of reducing the residual solvent in the photosensitive layer, preferably used among these solvents are those having a boiling point of 140° C. or less and more preferably 130° C. or less. When two or more solvents are used in combination, it is preferable to select a combination of solvents each having a boiling point of 140° C. or less.

Such low-boiling solvents include methanol (boiling point: 65.0° C.), ethanol (boiling point: 78.5° C.), 1-methoxy-2-propanol (boiling point: 118° C.), methyl ethyl ketone (boiling point: 80° C.), acetonitrile (boiling point: 81.6° C.), tetrahydrofuran (boiling point: 66.0° C.), 2-methoxyethanol (boiling point: 124.6° C.), 1-propanol (boiling point: 97.2° C.), 2-propanol (boiling point: 82.3° C.), 3-pentanone (boiling point: 86° C.) etc., and any of these solvents can be used preferably in the first aspect of the present invention. From the viewpoint of the solubility of dyes such as IR absorbers and initiators, at least one kind of alcohol-type solvent is preferably contained.

The concentration of the solid content in the photosensitive layer coating solution is preferably 2 to 50% by weight.

The method of applying the photosensitive layer coating solution onto the support is not particularly limited, and any method known in the art can be selected and used. For example, rotational coating, wire bar coating, dip coating, air knife coating, roll coating, blade coating and curtain coating can be used.

The amount of the photosensitive layer applied can mainly influences the sensitivity of the photosensitive layer, the developing properties, the strength and printing resistance of the exposed coating, and is preferably selected as necessary depending on the intended use. If the coating amount is too low, printing resistance is not satisfactory. On the other hand, if the coating amount is too high, the sensitivity is lowered, the exposure requires a long time and the development treatment requires a longer time. The amount of the coating for the planographic printing plate for scanning exposure which is the principal object of the present invention, is, in terms of weight after drying, in the range of 0.5 to 5.0 $g/cm^2$, preferably 0.5 to 3.0 $g/cm^2$, and more preferably 0.6 to 2.0 $g/cm^2$.

The drying temperature after the photosensitive layer-coating solution is applied is preferably 80 to 200° C., more preferably 85 to 180° C. and most preferably 90 to 160° C. The drying time is 20 seconds to 5 minutes and preferably 25 seconds to 4 minutes. The drying time is even more preferably 30 seconds to 3 minutes.

If the coating temperature is less than 80° C. or the drying time is less than 20 seconds, the residual solvent may remain in a large amount and sensitivity may be lowered. On the other hand, if the coating temperature is 200° C. or more or the drying time is 5 minutes or more, the composition in the photosensitive layer deteriorates and this leads to lower sensitivity.

In a further preferable embodiment, the drying step after coating is conducted twice or more. That is, the drying conditions in the first drying step are preferably 10 to 120 seconds under the temperature condition of 90 to 140° C., and after the first drying step, the planographic printing plate is further subjected to drying, where the second and subsequent drying steps are conducted preferably under the conditions of a temperature of 50 to 100° C. for 30 seconds or more or at a reduced pressure of 30 mmHg or less.

Regardless of the components in the photosensitive layer coating solution or the type of solvent used in the preparation, the residual solvent can be reduced to the range of the present invention by sufficiently removing the solvent in this drying step. The upper limit of the drying temperature in this step is the temperature at which the heat polymerization initiator and the compound having a polymerizable unsaturated group are not stable, and thus is not preferable that the temperature be too high, and it is preferable that the amount of solvent is regulated by means of regulating the drying time so as to carry out a sufficient amount of drying.

Even if a solvent having a relatively high boiling point is used in preparation of the coating solution, the residual solvent can be reduced to the predetermined range by regulating the conditions in the drying step as described above. When a heater is used, the temperature conditions in the drying step can be controlled by regulating the temperature of the heater and the distance between the non-contact heater and the photosensitive layer. In the case of hot air drying, the conditions can be controlled by regulating the temperature of hot air and the amount of the air. The drying time in the case of a drying oven can be controlled by regulating the time in the oven, or the drying time in the case of continuous drying while conveying, can be controlled by regulating the conveying speed.

The content of the residual solvent can be detected by measuring the amount of the photosensitive layer coating solution after coating and drying and the amount thereof after the solvent was completely removed by heating and drying under reduced pressure.

Hereinafter, the other components in the photosensitive layer in the first aspect of the present invention will be described. The composition constituting the photosensitive layer is a heat (photo) polymerizable composition comprising I) an IR absorber, II) a heat polymerization initiator, III) a compound having a polymerizable unsaturated group, and preferably IV) a binder insoluble in water but soluble in an aqueous alkali solution.

The heat-polymerizable composition usable in the first aspect of the present invention includes those compositions constituting photosensitive, heat-sensitive image-recording layers as described in JP-A No. 8-108621, JP-A No. 9-34110, and JP-A No. 7-306528.

I) IR Absorber

The IR absorber contained in the photosensitive layer in the first aspect of the present invention is a material having the light-heat converting function of generating heat upon exposure with an infrared laser. The IR absorber used in the first aspect of the present invention is preferably a dye or pigment having a maximum absorption wavelength in the range of 760 to 1200 nm.

The dye may be any commercial dye including known dyes described in e.g. "Senryo Binran" (Dye Handbook). (published in 1970 and compiled by Society of Synthetic Organic Chemistry, Japan). Examples of such dyes include azo dyes, metal complex salt azo dyes, pyrazolone azo dyes, naphthoquinone dyes, anthraquinone dyes, phthalocyanine dyes, carbonium dyes, quinone imine dyes, methine dyes, cyanine dyes, squarylium dyes, pyrylium salts and metal thiolate complexes.

Examples of preferable dyes include the cyanine dyes described in JP-A No. 58-125246, JP-A No. 59-84356, JP-A No. 59-202829, JP-A No. 60-78787 etc., the methine dyes described in JP-A No. 58-173696, JP-A No. 58-181690, JP-A No. 58-194595 etc., the naphthoquinone dyes described in JP-A No. 58-112793, JP-A No. 58-224793, JP-A No. 59-48187, JP-A No. 59-73996, JP-A No. 60-52940, JP-A No. 60-63744 etc., the squarylium dyes described in JP-A No. 58-112792 etc., and the cyanine dyes described in GB Patent No. 434,875.

Further, the near infrared ray-absorbing sensitizer described in U.S. Pat. No. 5,156,938 is also preferably used. Also preferably used are the aryl benzo(thio)pyrylium salts described in U.S. Pat. No. 3,881,924, the trimethine thiopyrylium salts described in JP-A No. 57-142645 (U.S. Pat. No. 4,327,169), the pyrylium type compounds described in JP-A No. 58-181051, JP-A No. 58-220143, JP-A No. 59-41363, JP-A No. 59-84248, JP-A No. 59-84249, JP-A No. 59-146063, and JP-A No. 59-146061, the cyanine dyes described in JP-A No. 59-216146, the pentamethine thiopyrylium salts described in U.S. Pat. No. 4,283,475, and the pyrylium compounds described in Japanese Patent Application Publication (JP-B) No. 5-13514 and JP-B No. 5-19702.

Other preferable examples of dyes include the near infrared ray-absorbing dyes of general formulae (I) and (II) described in U.S. Pat. No. 4,756,993.

Particularly preferable dyes among those described above are the cyanine dyes, squarylium dyes, pyrylium salts, and nickel-thiolate complexes. The cyanine dyes are more preferable, and particularly the cyanine dyes shown in general formula (I) below are the most preferable.

General formula (I)

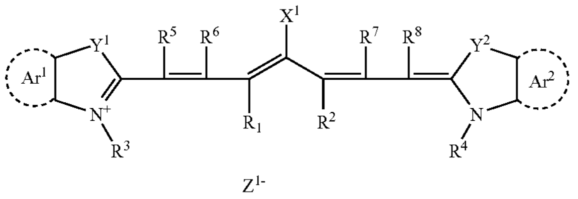

In the general formula (I), $X^1$ represents a halogen atom or $X^2$-$L^1$. Here, $X^2$ represents an oxygen atom or a sulfur atom, $L^1$ represents a hydrocarbon group having 1 to 12 carbon atoms. $R^1$ and $R^2$ independently represent a hydrocarbon group having 1 to 12 carbon atoms. For storage stability of the photosensitive layer coating solution, $R^1$ and $R^2$ are preferably $C_2$ or more hydrocarbon groups, and $R^1$ and $R^2$ are more preferably combined to form a 5- or 6-memberred ring.

$Ar^1$ and $Ar^2$ may be the same or different, and represent an aromatic hydrocarbon group which may have a substituent group. Preferable examples of the aromatic hydrocarbon group include a benzene ring and a naphthalene ring. Preferable examples of the substituent group include a hydrocarbon group having 12 or less carbon atoms, a halogen atom and a alkoxy group having 12 or less carbon atoms. $Y^1$ and $Y^2$ may be the same or different, and represent a sulfur atom and a dialkyl methylene group having 12 or less carbon atoms. $R^3$ and $R^4$ may be the same or different, and represent a hydrocarbon group having 20 or less carbon atoms which may have a substituent group. Preferable examples of the substituent group include an alkoxy group having 12 or less carbon atoms, a carboxyl group and a sulfo group. $R^5$, $R^6$, $R^7$ and $R^8$ may be the same or different, and represent a hydrogen atom and a hydrocarbon group having 12 or less carbon atoms. In consideration of the availability of the starting materials, these groups are preferably hydrogen atoms. $Z^{1-}$ represents a counter anion. However, if any one of $R^1$ to $R^8$ is substituted by a sulfo group, $Z^{1-}$ is not necessary. Preferable examples of $Z^{1-}$ include halogen ion, perchlorate ion, tetrafluoroborate ion, hexafluorophosphate ion, and sulfonate ion and particularly preferably perchlorate ion, hexafluorophosphate ion, and aryl sulfonate ion.

For use in the present invention, preferable examples of the cyanine dyes shown in general formula (I) are those described in columns [0017] to [0019] in Japanese Patent Application No. 11-310623.

The pigments used preferably in the present invention, include commercial pigments and those described in Color Index (C. I.) Handbook, "Saishin Ganryo Binran" (Newest Pigment Handbook) (published in 1977 and compiled by Japanese Society of Pigment Technology), "Saishin Ganryho Oyo Gijyutsu" (Newest Pigment Applied Technology) (published in 1986 by CMC), and "Insatsu Inki Gijyutsu" (Printing Ink Technology) (published in 1984 by CMC).

Examples of the type of pigment include black pigments, yellow pigments, orange pigments, brown pigments, red pigments, violet pigments, blue pigments, green pigments, fluorescent pigments, metallic powder pigments, and other pigments such as polymer-binding pigments. Specifically, it is possible to use insoluble azo pigments, azo lake pigments, condensed azo pigments, chelate azo pigments, phthalocyanine type pigments, anthraquinone type pigments, perylene and perinone type pigments, thioindigo type pigments, quinacridone type pigments, dioxazine type pigments, isoindolinone type pigments, quinophthalone type pigments, dyed lake pigments, azine pigments, nitroso pigments, nitro pigments, natural pigments, fluorescent pigments, inorganic pigments, carbon black etc. A preferable pigment among those described above is carbon black.

These pigments may be used with or without being subjected to surface treatment. The surface treatment methods include coating the surface thereof with resin or wax, allowing a surfactant to adhere thereto, and bonding a reactive material (e.g., a silane coupling agent, an epoxy compound, a polyisocyanate etc.) onto the surface of the pigment. These surface treatment methods are described in "Kinzoku Sekken no Seishitsu to Oyo" (Properties and Application of Metallic Soap) (Sachi Shobo), "Insatsu Inki Gijyutsu" (Printing Ink Technology) (published in 1984 by CMC) and "Saishin Ganryho Oyo Gijyutsu" (Newest Pigment Applied Technology) (published in 1986 by CMC).

The particle diameters of the pigments are in the range of preferably 0.01 to 10 μm, more preferably 0.05 to 1 μm and most preferably 0.1 to 1 μm. Particle diameters of less than 0.01 m are not preferable in respect of the stability of dispersion in the photosensitive layer coating solution, whereas particle diameters of more than 10 μm are not preferable either in respect of the uniformity of the photosensitive layer.

As the method of dispersing the pigments, any known dispersion techniques used in production of inks or toners can be used. Examples of the dispersing machine include a supersonic dispersing device, sand mill, attritor, pearl mill, super mill, ball mill, impeller, disperser, KD mill, colloid mill, dynatron, triple roll mill, press kneader etc. These are described in detail in "Saishin Ganryo Oyo Gijyutsu" (Newest Pigment Applied Technology) (published in 1986 by CMC).

Along with other components, these IR absorbers may be added to the same layer or to a separately provided layer such that in the resultant negative image-forming material, the optical density of the photosensitive layer at the maximum absorption wavelength which is in the range of 760 to 1200 nm is preferably in the range of 0.1 to 3.0. If the optical density is outside of this range, the sensitivity tends to be lowered. Because the optical density is determined by both the amount of the IR absorber added and the thickness of the photosensitive layer, the predetermined optical density can be achieved by regulating both conditions. The optical density of the photosensitive layer can be measured in a usual manner. For this measurement, there is a method wherein the photosensitive layer having a thickness after drying which is in a range determined suitable for the planographic printing plate, is formed on e.g. a transparent or white support and then measured by a transmission-type optical densitometer, or a method wherein the photosensitive layer is formed on a reflective support such as aluminum and measured for its reflection density.

II) Polymerization Initiator

The polymerization initiator refers to a compound which is used in combination with I) an IR absorber and generates radicals by the heat energy generated by the IR absorber upon exposure with an infrared laser, thus initiating and promoting polymerization of III) a compound having a polymerizable unsaturated group. In the first aspect of the present invention, the polymerization initiator includes not only the compound undergoing decomposition by the above heat energy to form polymerization-initiating components such as radicals, but also the compound functioning as an initiator due to the light energy of an infrared laser, or the compound functioning as a polymerization initiator due to both heat energy and light energy. The polymerization initiator used can be selected from known heat polymerization initiators and infrared ray-sensitive light polymerization initiators, and examples thereof include onium salts, triazine compounds having trihalomethyl group, peroxides, azo-type polymerization initiators, azide compounds and quinone diazide compounds, among which the onium salts are highly sensitive and preferably used.

The onium salts, which can be used preferably as the polymerization initiator in the first aspect of the present invention, will be now described. Preferable examples of the onium salts include iodonium salts, diazonium salts and sulfonium salts. In the first aspect of the present invention, these onium salts function not as the acid generator but as the radical polymerization initiator. The onium salts used preferably in the first aspect of the present invention are those onium salts represented by general formulae (II) to (IV):

General formula (II)

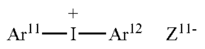

General formula (III)

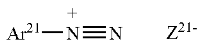

General formula (IV)

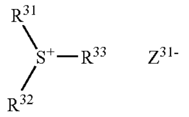

In general formula (II), $Ar^{11}$ and $Ar^{12}$ independently represent an aryl group having 20 or less carbon atoms which may have a substituent group. When this aryl group has a substituent group, the substituent group is preferably a halogen atom, a nitro group, an alkyl group having 12 or less carbon atoms, an alkoxy group having 12 or less carbon atoms or an aryloxy group having 12 or less carbon atoms. $Z^{11-}$ represents a counterion selected from the group consisting of halogen ion, perchlorate ion, tetrafluoroborate ion, hexafluorophosphate ion, and sulfonate ion, and it is preferably perchlorate ion, hexafluorophosphate ion or aryl sulfonate ion.

In general formula (III), $Ar^{21}$ represents an aryl group having 20 or less carbon atoms which may have a substituent group. Preferable examples of the substituent group include a halogen atom, a nitro group, an alkyl group having 12 or less carbon atoms, an alkoxy group having 12 or less carbon atoms, an aryloxy group having 12 or less carbon atoms, an alkyl amino group having 12 or less carbon atoms, a dialkyl amino group having 12 or less carbon atoms, an aryl amino group having 12 or less carbon atoms and a diaryl amino group having 12 or less carbon atoms. $Z^{21-}$ represents a counterion defined in the same way as $Z^{11-}$.

In general formula (IV), $R^{31}$, $R^{32}$ and $R^{33}$ may be the same or different, and represent a hydrocarbon group having 20 or less carbon atoms which may have a substituent group. Preferable examples of the substituent group include a halogen atom, a nitro group, an alkyl group having 12 or less carbon atoms, an alkoxy group having 12 or less carbon atoms, and an aryloxy group having 12 or less carbon atoms. $Z^{31-}$ represents a counterion defined in the same way as $Z^{11-}$.

In the first aspect of the present invention, examples of the onium salts that can be used preferably as the radical generator include those described in columns [0030] to [0033] in Japanese Patent Application No. 11-310623.

Known polymerization initiators such as the onium salts of general formulae (I) to (IV) in columns [0012] to [0050] in JP-A No. 9-34110 and the heat polymerization initiators described in column [0016] in JP-A No. 8-108621 are also preferably used.

The radical generator used as the heat polymerization initiator in the first aspect of the present invention has a maximum absorption wavelength of preferably 400 nm or less, more preferably 360 nm or less. By using the radical generator having such an absorption wavelength in the UV range, the image forming material can be handled under an incandescent lamp.

III) Compounds Having a Polymerizable Unsaturated Group

The compound having a polymerizable unsaturated group used in the first aspect of the present invention is an addition-polymerizable compound having at least one ethylenically unsaturated double bond, and is selected from those compounds having at least one, and preferably two or more, terminal ethylenically unsaturated bonds. A group of such compounds is used widely in the relevant industrial fields, and in the first aspect of the present invention, these compounds can be used without any particular limitation. These compounds include those having chemical forms such as monomers, prepolymers, that is, dimers, trimers and oligomers, as well as mixtures and copolymers thereof. Examples of such monomers and copolymers include unsaturated carboxylic acids (e.g., acrylic acid, methacrylic acid, itaconic acid, crotonic acid, isocrotonic acid, maleic acid etc.) and esters and amides thereof, and preferably used are esters of unsaturated carboxylic acids and aliphatic polyvalent alcohols and amides of unsaturated carboxylic acids and aliphatic polyvalent amines. Further, unsaturated carboxylates having nucleophilic substituent groups such as hydroxyl group, amino group, mercapto group etc., addition-reaction products of amides with monofunctional or multifunctional isocyanates or epoxy compounds, and dehydration condensation reaction products of amides with monofunctional or multifunctional carboxylic acids.

Further, unsaturated carboxylates having electrophilic substituent groups having isocyanato group, epoxy group etc., addition-reaction products of amides with monofunctional or multifunctional alcohols, amines or thiols, unsaturated carboxylates having eliminating substituent groups such as halogen group, tosyloxy group etc., and substitution-reaction products of amides with monofunctional or multifunctional alcohols, amines or thiols. Further, a group of those compounds wherein the above-described carboxylic acids have been replaced by unsaturated phosphonic acids, styrene, vinyl ethers etc. can also be used.

As the monomers, the esters of aliphatic multivalent alcohols and unsaturated carboxylic acids include e.g. oligomers of acrylates such as ethylene glycol diacrylate, triethylene glycol diacrylate, 1,3-butane diol diacrylate, tetramethylene glycol diacrylate, propylene glycol diacrylate, neopentyl glycol diacrylate, trimethylol propane triacrylate, trimethylol propane tri(acryloyloxy propyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxy ethyl) isocyanurate, polyester acrylate etc.

The methacrylates include tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane, bis[p-(methacryloxy ethoxy)phenyl] dimethyl methane etc.

The itaconates include ethylene glycol diitaconate, propylene glycol diitaconate, 1,3-butane diol diitaconate, 1,4-butane diol diitaconate, tetramethylene glycol diitaconate, pentaerythritol diitaconate, sorbitol tetraitaconate etc.

The crotonates include ethylene glycol dicrotonate, tetramethylene glycol dicrotonate, pentaerythritol dicrotonate, sorbitol tetradicrotonate etc.

The isocrotonates include ethylene glycol diisocrotonate, pentaerythritol diisocrotonate, sorbitol tetraisocrotonate etc.

The maleates include ethylene glycol dimaleate, triethylene glycol dimaleate, pentaerythritol dimaleate, sorbitol tetramaleate etc.

Other esters preferably used include e.g. the aliphatic alcohol-based esters described in JP-B No. 46-27926, JP-B No. 51-47334 and JP-A No. 57-196231, those having an aromatic skeleton described in JP-A No. 59-5240, JP-A No. 59-5241 and JP-A No. 2-226149, and those having amino group described in JP-A No. 1-165613.

Further, the ester monomers described above can also be used in the form of a mixture.

As the monomers, the amides of aliphatic polyvalent amines with unsaturated carboxylic acids include e.g. methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, xylylene bismethacrylamide etc.

Preferable examples of other amide type monomers include those having a cyclohexylene structure described in JP-B No. 54-21726.

Further, urethane type addition-polymerizable compounds produced by addition reaction between isocyanates and hydroxyl groups are also preferable, and examples thereof include vinyl urethane compounds containing two or more polymerizable vinyl groups in one molecule, which are prepared by adding vinyl monomers containing a hydroxyl group shown in general formula (V) below to polyisocyanates having two or more isocyanate groups in one molecule as described in JP-B No. 48-41708.

$CH_2{=}C(R)COOCH_2CH(R')OH$ General formula (V)

In the general formula V), R and R' each represents H or $CH_3$.

Further, the urethane acrylates described in JP-A No. 51-37193, JP-B No. 2-32293 and JP-B No. 2-16765, and the urethane compounds having an ethylene oxide-type skeleton described in JP-B No. 58-49860, JP-B No. 56-17654, JP-B No. 62-39417 and JP-B No. 62-39418 are also preferable.

Also, the addition-polymerizable compounds having an amino structure or sulfide structure in the molecule, described in JP-A No. 63-277653, JP-A No. 63-260909 and JP-A No. 1-105238, can be used to prepare photosensitive compositions very excellent in photosensitizing speed.

Other examples include the multifunctional acrylates and methacrylates such as polyacrylates and epoxy acrylates obtained by reacting epoxy resin with (meth)acrylic acid described in JP-A No. 48-64183, JP-B No. 49-43191 and JP-B No. 52-30490. Further, examples include the specific unsaturated compounds described in JP-B No. 46-43946, JP-B No. 1-40337 and JP-B No. 1-40336, and the vinyl phosphonic acid-type compounds etc. described in JP-A No. 2-25493. In some cases, a structure containing a perfluoroalkyl group described in JP-A No. 61-22048 is preferably used. Further, the photosetting monomers and oligomers described in the Journal of Japanese Adhesive Society, vol. 20, No. 7, pp. 300–308 (1984) can also be used.

How these addition-polymerizable compounds are used, that is, what structure is used, whether they are used singly or in combination, and in what amounts they are used, can be arbitrarily determined depending on the performance and design of the final sensitive material to be obtained. For example, they are selected from the following viewpoints. In respect of photosensitizing speed, their structure preferably has many unsaturated groups in one molecule, and in many cases, they are preferably at least bifunctional. To increase the strength of the part of an image i.e. the cured film, they are preferably at least trifunctional. Further, a method of regulating both photosensitivity and strength by combined use of those molecules (e.g. acrylates, methacrylates, styrene type compounds, and vinyl ether type compounds) having different functionalities and different polymerizable groups is also effective. The high-molecular compounds or highly hydrophobic compounds, though being excellent in photosensitizing speed and film strength, may be undesirable in some cases in respect of developing speed and precipitation in the developing solution.

The method of selecting and using the addition-polymerizable compound is an important factor for compatibility and dispersibility with other components (e.g. a binder polymer, an initiator, a coloring agent etc.) in the photosensitive composition, and the compatibility may be improved by using e.g. a low-purity compound or a combination of two or more compounds. In the original for use in the planographic printing plate, a specific structure may be selected for the purpose of improving adhesion to a support, or an overcoat etc. described below. It is advantageous for the ratio of the addition-polymerizable compound blended in the photosensitive composition to be high in terms of sensitivity, but a too high ratio causes undesirable phase separation, problems in processing due to the adhesion of the photosensitive composition (e.g., defects in processing caused by transfer and adhesion of the sensitive component), and precipitation from the developing solution for use in the planographic printing plate. From these viewpoints, the compounding ratio in many cases is preferably 5 to 80% by weight, more preferably 25 to 75% by weight, relative to all components in the composition. The addition-polymerizable compounds may be used singly or in combination thereof. Further, from the viewpoints of the degree of inhibition of polymerization by oxygen, the degree of resolution, stability, a change in reflectance, surface viscosity etc., a suitable structure, compounding and amount thereof can be arbitrarily selected in the method of using the addition-polymerizable compound, and further a layer structure and a coating method such as prime-coating and top-coating can also be carried out as necessary.

IV) Binder Insoluble in Water but Soluble in an Aqueous Alkali Solution

In the planographic printing plate in the first aspect of the present invention, it is preferable that a binder polymer is further used in the photosensitive layer. The binder is preferably a linear organic polymer. The "linear organic polymer" is not particularly limited. Preferably, a linear organic polymer which is soluble or swells in water or weakly alkaline water enabling development in water or development in weakly alkaline water is selected. The linear organic polymer is selected not only as a film-forming agent for the composition but is also selecting depending on whether it is used as water, weakly alkaline water, or an organic solvent developing agent. For example, water development is feasible if a water-soluble organic polymer is used. Such linear organic polymers include addition polymers having carboxylic acid groups in their side chains, such as those described in e.g. JP-A No. 59-44615, JP-B No. 54-34327, JP-B No. 58-12577, JP-B No. 54-25957, JP-A No. 54-92723, JP-A No. 59-53836, and JP-A No. 59-71048, that is, methacrylic acid copolymers, acrylic acid copolymers, itaconic acid copolymers, crotonic acid copolymers, maleic acid copolymers, and partially esterified maleic acid copolymers. Further, there are acidic cellulose derivatives having carboxylic acid groups in their side chains. Besides, those addition polymers having hydroxyl groups, to which cyclic acid anhydrides have been added, are useful.

Among these copolymers, [benzyl(meth)acrylate/(meth)acrylic acid/as necessary other addition-polymerizable vinyl monomer]copolymers and [allyl(meth)acrylate/(meth)acrylic acid/as necessary other addition-polymerizable vinyl monomer]copolymers are particularly excellent in the balance among film strength, sensitivity and developing properties and are thus preferable.

Further, the urethane type binder polymers containing acid groups described in JP-B No. 7-12004, JP-B No. 7-120041, JP-B No. 7-120042, JP-B No. 8-12424, JP-A No. 63-287944, JP-A No. 63-287947, JP-A No. 1-271741, JP Patent Appln. No. 10-116232, etc. are very excellent in strength and thus advantageous in respect of printing resistance and low-exposure suitability.

Further, the binder having an amide group described in JP-A No. 11-171907 is suitable because it is excellent in both developing properties and film strength.

As other water-soluble linear organic compounds, polyvinyl pyrrolidone, polyethylene oxide etc. are useful. To increase the strength of the cured film, alcohol-soluble nylon, polyethers of 2,2-bis-(4-hydroxyphenyl)-propane and epichlorohydrin, etc. are also useful. These linear organic polymers can be mixed throughout an arbitrary amount in the entire composition. However, amounts of more than 90% by weight does not give good results in respect of the strength of formed images, etc. Preferably, the amount is 30 to 85% by weight. The ratio of the compound having photo-polymerizable ethylenically unsaturated double bond/ the linear organic polymer by weight is preferably in the range of from 1/9 to 7/3.

The binder polymer used in the first aspect of the present invention is a polymer substantially insoluble in water but soluble in an aqueous alkali solution. Accordingly, an environmentally undesirable organic solvent is not used as the developing solution, or if used, its amount may be very small. The acid value (i.e. acid content per g of the polymer, expressed in terms of chemical equivalence) and the molecular weight of the binder polymer are suitably selected from the viewpoint of image strength and developing properties. The acid value is preferably in the range of 0.4 to 3.0 meq/g, and the molecular weight is preferably 3000 to 500,000, and more preferably, the acid value is in the range of 0.6 to 2.0, and the molecular weight is in the range of 10,000 to 300,000.

V) Other Components

In the photosensitive composition in the first aspect of the present invention, other components suitable for the use and production process thereof can be added as necessary. Hereinafter, examples are given of preferable additives.

V-1) Co-Sensitizer

By use of a certain additive (referred to hereinafter as co-sensitizer), the sensitivity can be further improved. Its working mechanism is not clear, but it is thought to be based mainly on the following chemical process: That is, it is estimated that various intermediate active species (radials, cations) generated in the optical reaction initiated by the heat-polymerization initiator and in the subsequent addition-polymerization reaction, react with the co-sensitizer to form new active radicals. Such co-sensitizers can be roughly divided into (a) those capable of forming active radicals upon reduction, (b) those capable of forming active radicals upon oxidation, and (c) those converted into highly active radicals by reaction with low-activity radicals or those acting as chain transferring agents, but there are many compounds which cannot be definitely classified into one of these categories.

(a) Compound Forming Active Radicals by Reduction

Compounds having carbon-halogen bonds: It is considered that the carbon-halogen bonds are reductively cleaved to generate active radicals. Specifically, trihalomethyl-s-triazines and trihalomethyl oxadiazoles can be preferably used.

Compounds having nitrogen-nitrogen bonds: It is considered that the nitrogen-nitrogen bonds are reductively cleaved to form active radicals. Specifically, hexaryl bisimidazoles can be preferably used.

Compounds having oxygen-oxygen bonds: It is considered that the oxygen-oxygen bonds are reductively cleaved to generate active radicals. Specifically, organic peroxides can be preferably used.

Onium compounds: It is considered that carbon-heteroatom bonds or oxygen-nitrogen bonds are reductively cleaved to generate active radicals. Specifically, diaryl iodonium salts, triaryl sulfonium salts, and N-alkoxy pyridinium (azinium) salts can be preferably used.

Ferrocene, iron arene complexes: These are capable of forming active radicals reductively.

(b) Compounds Forming Active Radicals upon Oxidation

Alkyl ate-complexes: It is considered that the carbon-heteroatom bonds are oxidatively cleaved to generate active radicals. Specifically, triaryl alkyl borates can be preferably used.

Alkyl amine compounds: It is considered that a C—X bond with carbon adjacent to nitrogen is cleaved by oxidation to form active radicals. X is preferably a hydrogen atom, a carboxyl group, trimethyl silyl group, benzyl group etc. Specific examples include ethanol amines, N-phenyl glycines and N-trimethyl silyl methyl anilines.

Sulfur- or tin-containing compounds: The above-described amines in which nitrogen atoms have been replaced by sulfur atoms or tin atoms can form active radicals by the same action. Further, those compounds having S—S bonds are known to act as sensitizers by cleavage of the S—S bonds.

α-Substituted methyl carbonyl compounds: These are capable of forming active radicals by cleaving carbonyl-α carbon bonds upon oxidation. Further, those compounds having carbonyl replaced by oxime ether exhibit the same action. Specific examples include 2-alkyl-1-[4-(alkylthio) phenyl]-2-morpholinopronone-1 and analogues thereof, as well as oxime ethers prepared by reacting said compounds with hydroxy amines and etherifying N—OH.

Sulfinates: These are capable of forming active radicals upon reduction. Specific examples include sodium aryl sulfinate etc.(c) Compounds converted into highly active radicals by reaction with radicals or compounds acting as chain transferring agents: For example, a group of those compounds having SH, PH, SiH or GeH in the molecule are used. These compounds can form radicals by donating hydrogen to low-activity radicals or by undergoing oxidization and subsequent deprotonation. Specific examples include 2-mercaptobenzimidazoles etc. A large number of other specific examples of these co-sensitizers which are additives for improving sensitivity are mentioned in e.g. JP-A No. 9-236913, and such compounds can also be used in the present invention. Hereinafter, examples of some of these compounds are given, but these are not intended to limit the present invention.

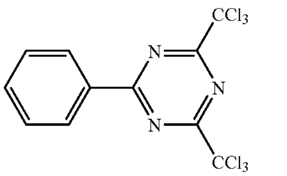

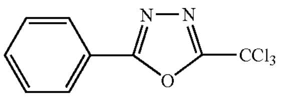

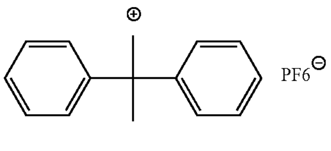

-continued

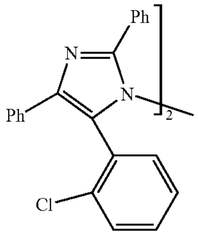

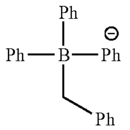

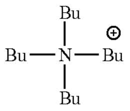

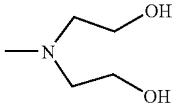

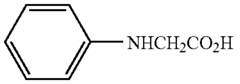

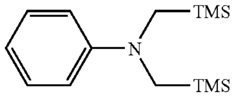

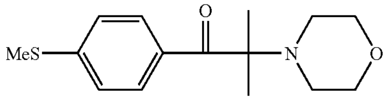

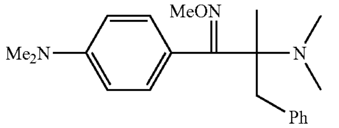

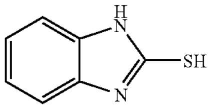

As with the sensitizing dyes described above, these co-sensitizers can also be chemically modified in various ways in order to improve their characteristics. For example, the co-sensitizers can be modified by bonding them to sensitizing dyes, surfactants, addition-polymerizable unsaturated compounds or other parts, introducing hydrophilic sites, improving compatibility, introducing substituent groups for inhibition of crystalline precipitation, introducing substituent groups for improving adhesion, or polymerizing them.

These co-sensitizers can be used singly or in combination thereof. The amount of the co-sensitizer used is in the range of 0.05 to 100 parts by weight, preferably 1 to 80 parts by weight, more preferably 3 to 50 parts by weight, for 100 parts by weight of the compound having an ethylenically unsaturated double bond.

V-2) Polymerization Inhibitors

In the first aspect of the present invention, in addition to the fundamental components described above, a small amount of a heat-polymerization inhibitor is preferably added in order to inhibit undesired heat polymerization of the compound having a polymerizable ethylenically unsaturated double bond during the production or storage of the photosensitive composition. Preferable examples of the heat polymerization inhibitor include hydroquinone, p-methoxyphenol, di-t-butyl-p-cresol, pyrogallol, t-butyl catechol, benzoquinone, 4,4'-thiobis(3-methyl-6-t-butyl phenol), 2,2'-methylene bis(4-methyl-6-t-butyl phenol), N-nitrosophenyl hydroxylamine primary cerium salts etc. The amount of the heat-polymerization inhibitor added is preferably about 0.01 to about 5% by weight relative to the weight of the entire composition. To prevent the inhibition of polymerization by oxygen, a higher fatty acid derivative such as behenic acid or behenic amide may be added as necessary so that it can be locally present on the surface of the photosensitive layer in the drying step after application to the support etc. which will be the original in the planographic printing plate. The amount of the higher fatty acid derivative added is preferably about 0.5 to about 10% by weight relative to the entire composition.

V-3) Coloring Agents

Further, when the photosensitive composition in the first aspect of the present invention is used in the planographic printing plate, dyes or pigments may be added for the purpose of coloring the photosensitive layer. Inspection of the plate, that is, the ability to visually recognize the printing plate after the plate is made and the suitability thereof for an image densitometer can thereby be improved. As the coloring agent, many dyes can cause a reduction in the sensitivity of the photo-polymerized photosensitive layer, so pigments are particularly preferably for use as the coloring agent. Examples of the coloring agent include pigments such as phthalocyanine type pigments, azo type pigments, carbon black and titanium oxide, and dyes such as ethyl violet, crystal violet, azo type dyes, anthraquinone type dyes and cyanine type dyes. The amount of the dyes and pigments added is preferably about 0.5 to about 5% by weight of the entire composition.

V-4) Other Additives

When the photosensitive composition in the first aspect of the present invention is used in the planographic printing plate, known additives such as inorganic fillers for improving the physical properties of the cured film, other plasticizers, and fat-sensitizing agents for improving the attachment of ink to the surface of the photosensitive layer, may also be added.

Examples of the plasticizers include e.g. dioctyl phthalate, didodecyl phthalate, triethylene glycol dicaprylate, dimethyl glycol phthalate, tricresyl phosphate, dioctyl adipate, dibutyl sebacate, triacetyl glycerin etc., and when the binder is used, these can be added in an amount of 10% by weight or less relative to the total weight of the compound having an ethylenically unsaturated double bond and the binder.

Further, UV initiator and mature crosslinking agents for enhancing the effect of heating and exposure after development can be added for the purpose of improving the film strength (printing resistance) described below.

It is also possible to provide additives or an interlayer between the photosensitive layer and the support for improving the adhesion thereof and for improving the removability of the non-exposed photosensitive layer by development. For example, the adhesion is improved and the printing resistance can be raised by adding those compounds having a diazonium structure or those compounds (e.g. phosphone compounds etc.) having a relative strong interaction with the support or by providing a prime-coating. The developing properties of non-image parts and the staining properties can be improved by adding hydrophilic polymers such as polyacrylic acid and polysulfonic acid or by proving a prime-coating thereof.

(Protective Layer)

Usually, the planographic printing plate in the first aspect of the present invention is provided preferably with a protective layer on a layer of the photosensitive composition so that it can be exposed in the air. Because of the protective layer, low-molecular compounds such as oxygen and basic materials in the air, which will inhibit the image-forming reaction occurring in the photosensitive layer upon exposure, are prevented from penetrating into the photosensitive layer, and thus the planographic printing plate can be exposed in the air. Accordingly, the desired characteristics of the protective layer are low permeability of low-molecular compounds such as oxygen, good permeability of light used in exposure, excellent adhesion to the photosensitive layer, and high removability in the development step after exposure.

The design of the protective layer has been described in detail in U.S. Pat. No. 3,458,311 and JP-A No. 55-49729. The materials used in the protective layer are preferably water-soluble polymers relatively excellent in crystallinity, and specifically, water-soluble polymers such as polyvinyl alcohol, polyvinyl pyrrolidone, acidic celluloses, gelatin, gum arabic and polyacrylic acid are known, among which polyvinyl alcohol can be used as a major component to give the best result for basic characteristics such as oxygen barrier properties and removability by development. The polyvinyl alcohol used in the protective layer may be partially replaced by ester, ether and acetal insofar as it has unsubstituted vinyl alcohol units for giving necessary oxygen barrier properties and water solubility. Similarly, it may have other copolymerizable components.

Examples of the polyvinyl alcohol include those hydrolyzed to 71 to 100% with a molecular weight in the range of 300 to 2400. Specific examples include PVA-105, PVA-110, PVA-117, PVA-117H, PVA-120, PVA-124, PVA-124H, PVA-CS, PVA-CST-, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, PVA-8 etc. which are available from Kuraray Co., Ltd.

The components (the selected PVA and additives used) in the protective layer, the amount of the coating, etc. are selected in consideration of fogging, adhesion and scratch resistance in addition to oxygen barrier properties and removability by development. In general, as the degree of hydrolysis of PVA used becomes higher (or the content of unsubstituted vinyl alcohol units in the protective layer becomes higher) or as the thickness of the film is increased, oxygen barrier properties are generated, which are advantageous in terms of sensitivity. However, if the oxygen barrier properties are improved to an extreme, there arises the problem that undesired polymerization reactions may occur during production or storage, or unnecessary fogging and thick lines in an image may be generated upon exposure of an image. In addition, the adhesion of the protective layer to the image portion and the scratch resistance thereof are very important for handling of the plate. That is, if a hydrophilic layer consisting of a water-soluble polymer is laminated on a lipophilic polymerized layer, the film may be stripped easily due to insufficient adhesion, and the stripped portion causes defects such as insufficient curing of the film because of the inhibition of polymerization by oxygen.

To deal with this problem, various proposals for improving the adhesion between these 2 layers have been made. For example, U.S. Pat. Nos. 292,501 and 44,563 disclose an acrylic emulsion, a water-insoluble vinyl pyrrolidone-vinyl acetate copolymer, etc. are mixed in an amount of 20 to 60% by weight in a hydrophilic polymer based on polyvinyl alcohol and then laminated on a polymer layer thereby achieving satisfactory adhesion. Any of these known techniques can be applied to the protective layer in the present invention. The method of applying the protective layer is described in detail in e.g. U.S. Pat. No. 4,458,311 and JP-A No. 55-49729.

Further, the protective layer can be endowed with other functions. For example, a coloring agent (water-soluble dye etc.) excellent in permeability of light having the wavelength used in exposure and capable of efficiently absorbing light having a wavelength not used in forming images can be added thereto to further improve safe write suitability without causing a drop in sensitivity.

(Support)

The support used in the planographic printing plate in the first aspect of the present invention is not particularly limited insofar as it is a dimensionally stable plate, and examples thereof include a paper, a paper with plastics (e.g., polyethylene, polypropylene, polystyrene etc.) laminated thereon, a metal plate (e.g., aluminum, zinc, copper etc.), plastic film (e.g., diacetate cellulose, triacetate cellulose, propionate cellulose, butyrate cellulose, acetate butyrate cellulose, nitrate cellulose, polyethylene terephthalate, polyethylene, polystyrene, polypropylene, polycarbonate, polyvinyl acetal etc.), etc. These may be single-component sheets such as a resinous film or a metal plate, or laminates consisting of two or more materials laminated therein, such as paper or plastic film having the above-described metal laminated or vapor-deposited thereon or laminate sheets consisting of different plastic films, etc.

The support is preferably a polyester film or an aluminum plate, of which the aluminum plate is excellent in dimensional stability and relatively inexpensive and is thus particularly preferable. The aluminum plate is preferably a pure aluminum plate or an aluminum-based alloy plate containing a trace of different elements, or may be a plastic film having aluminum laminated or vapor-deposited thereon. The different elements contained in the aluminum alloy include silicon, iron, manganese, copper, magnesium, chromium, zinc, bismuth, nickel, titanium etc. The content of the different elements in the alloy is up to 10% by weight. Aluminum particularly preferable in the present invention is pure aluminum, but because production of absolutely pure aluminum is difficult in respect of refining techniques, aluminum may contain a trace of different elements. The composition of the aluminum plate thus used in the present invention is not limited, and any aluminum plates made of a known and conventionally used aluminum material can be used as necessary.

The thickness of the aluminum plate is about 0.1 to 0.6 mm, preferably 0.15 to 0.4 mm and most preferably 0.2 to 0.3 mm.

Before the surface of the aluminum plate is roughened, degreasing treatment with e.g. a surfactant, an organic solvent or an aqueous alkali solution is conducted as necessary for removal of rolling oil from the surface thereof.

The roughening of the surface of the aluminum plate is conducted using various methods such as mechanical surface roughening, surface roughening by electrochemical dissolution of the surface and chemically and selectively dissolving the surface. The mechanical method can make use of known techniques such as ball grinding, brush grinding, blast grinding and buff grinding. The electrochemical roughening method includes roughening the surface in a bath of a hydrochloric acid or nitric acid electrolyte by use of alternating current or direct current. Further, a combination of both these methods can also be utilized as disclosed in JP-A No. 54-63902.

After the aluminum plate thus surface-roughened is subjected as necessary to alkali etching treatment and neutralization treatment, the plate can be subjected to anodizing treatment in order to improve the water retention and abrasion resistance of the surface. The electrolyte for use in the anodizing treatment of the aluminum plate can be selected from various electrolytes for forming a porous oxide film, and generally sulfuric acid, phosphoric acid, oxalic acid, chromic acid or a mixed acid thereof is used. The concentration of the electrolyte is determined suitably depending on the type of the electrolyte.

The conditions for the anodizing treatment are varied depending on the electrolyte used and can thus not be generalized, but it is usually preferable that the concentration of the electrolyte is 1 to 80% by weight, the liquid temperature is 5 to 70° C., the current density is 5 to 60 A/dm$^2$, the voltage is 1 to 100 V, and the electrolysis time is 10 seconds to 5 minutes.

The amount of the anodized film is preferably not less 1.0 g/m$^2$ and more preferably in the range of 2.0 to 6.0 g/m$^2$. If the anodized film is less than 1.0 g/m$^2$, the printing resistance becomes insufficient and the non-image portion on the planographic printing plate is easily scratched thus having the so-called "scratch staining" which is caused by ink adhering to the scratch upon printing.

The printing surface of the support of the planographic printing plate is subjected to this type of anodizing treatment, but because of the line of electric force sent to the back thereof as well, 0.01 to 3 g/m$^2$ anodized film is generally formed on the back also.

The treatment for rendering the surface of the support hydrophilic is conducted after the anodizing treatment described above and a method known in the art can be used. Such hydrophilicity-conferring treatment includes the alkali metal silicate (e.g., an aqueous solution of sodium silicate) method disclosed in U.S. Pat. Nos. 2,714,066, 3,181,461, 3,280,734 and 3,902,734. In this method, the support is dipped or hydrolyzed in an aqueous solution of sodium silicate. Besides, the method of treatment with potassium fluorozirconate as disclosed in JP-B No. 36-22063 and the method of treatment with polyvinyl phosphonic acid as disclosed in U.S. Pat. Nos. 3,276,868, 4,153,461, and 4,689,272 are used.

Among these, particularly preferable hydrophilicity-conferring treatment in the first aspect of the present invention is the treatment with silicates. The treatment with silicates is described below.

The anodized film on the aluminum plate which was subjected to the treatment described above is dipped for example at 15 to 80° C. for 0.5 to 120 seconds in an aqueous solution of an alkali metal silicate at a concentration of 0.1 to 30% by weight, preferably 0.5 to 10% by weight, and at a pH value of 10 to 13 as determined at 25° C. If the pH value of the aqueous alkali metal silicate solution is 10 or less, the solution is gelled, while if the pH value is higher than 13.0, the anodized film is dissolved. As the alkali metal silicate used in the first aspect of the present invention, sodium silicate, potassium silicate, lithium silicate etc. are used. The hydroxide used for raising the pH value of the aqueous alkali metal silicate solution includes sodium hydroxide, potassium hydroxide, lithium hydroxide etc. Alkaline earth metal salts or the group IVB metal salts may be incorporated into the treating solution described above. The alkaline earth metals include nitrates such as calcium nitrate, strontium nitrate, magnesium nitrate and barium nitrate, and water-soluble salts such as nitrate, hydrochloride, phosphate, acetate, oxalate and borate. The group IVB metal salts include titanium tetrachloride, titanium trichloride, titanium potassium fluoride, titanium potassium oxalate, titanium sulfate, titanium tetraiodide, zirconium chloride oxide, zirconium dioxide, zirconium oxychloride, zirconium tetrachloride etc. The alkaline earth metal salts or the group IVB metal salts can be used singly or in combination thereof. The amount of these metal salts is preferably in the range of 0.01 to 10% by weight, more preferably 0.05 to 5.0% by weight.

Because the hydrophilicity of the surface of the aluminum plate is further improved by silicate treatment, the ink hardly adheres to the non-image portion during printing, and the stain resistance is improved.

The support is provided as necessary with a back coat on the back thereof. The back coat is preferably a coating layer consisting of metal oxides obtained by hydrolysis and polycondensation of the organic polymeric compounds described in JP-A No. 5-45885 and the organic or inorganic metal compounds described in JP-A No. 6-35174.

Among these coating layers, coating layers of metal oxides obtained from alkoxy silicon compounds such as $Si(OCH_3)_4$, $Si(OC_2H_5)_4$, $Si(OC_3H_7)_4$ and $Si(OC_4H_9)_4$ are particularly preferable because these layers are excellent in development resistance and these materials are easily available and inexpensive.

(Exposure)

The planographic printing plate in the first aspect of the present invention can be prepared in the manner described above. This planographic printing plate is exposed with infrared rays of wavelengths of from 760 nm to 1200 nm emitted by a solid laser and a semiconductor laser. Scanning exposure for image formation can be conducted using a known device. The exposure device used can be selected from those devices in the inter drum system, outer drum system and flat head system.

In the first aspect of the present invention, the development treatment may be conducted just after laser exposure, but heat treatment is conducted preferably between the laser exposure step and the development step. Heat treatment is conducted preferably in the range of 80 to 150° C. for 10 seconds to 5 minutes. By this heat treatment, the laser energy necessary for recording can be reduced at the time of laser exposure.

(Development)

When the planographic printing plate using the photosensitive composition in the first aspect of the present invention is used as an image-forming material, the planographic printing plate is usually subjected to image exposure and the non-exposed portion in the photosensitive layer is removed with a developing solution to give an image. For use of these photosensitive compositions in preparing in the planographic printing plate, preferable developing solutions are those developing solutions described in JP-B No. 57-4727, and preferably used are aqueous solutions of inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, and ammonia water, and organic alkali agents such as monoethanol amine and diethanol amine. These compounds are added such that the concentration of the alkali solution is 0.1 to 10% by weight, preferably 0.5 to 5% by weight.

As necessary, such an aqueous alkali solution can contain a small amount of surfactants and organic solvents such as benzyl alcohol, 2-phenoxyethanol, and 2-butoxyethanol. Examples include those described in U.S. Pat. Nos. 3,375,171 and 3,615,480 can be mentioned.

Further, the developing solutions described in JP-A No. 50-26601, JP-A No. 58-54341, JP-B No. 56-39464 and JP-B No. 56-42860 are also excellent.

By using a composition in the photosensitive layer in the first aspect of the present invention having high solubility in water, it is soluble in neutral water or weakly alkaline water, and the planographic printing plate with this constitution can be printed by introducing it into a printing machine and exposing and developing it in the machine.

The planographic printing plate thus obtained is coated with an desensitizing gum as necessary and then subjected to printing, but if the planographic printing plate with higher printing resistance is desired, it is subjected to burning treatment.

When the planographic printing plate is subjected to burning, before burning, the plate is treated preferably with those baking conditioner described in JP-B No. 61-2518, JP-B No. 55-28062, JP-A No. 62-31859 and JP-A No. 61-159655.

For this treatment, use is made of a method of applying a sponge or adsorbent cotton impregnated with the baking conditioner onto the planographic printing plate, or dipping the printing plate in a vat filled with the baking conditioner, or coating by an automatic coater. Further, better results are given by applying the baking conditioner uniformly with an squeezer or with squeeze rollers.

The planographic printing plate which was subjected to burning can be subjected to conventional treatments such as washing with water and gum coating treatment, but when a baking conditioner containing water-soluble polymers etc. was used, the so-called desensitizing treatment such as gum coating treatment can be omitted.

The planographic printing plate obtained in the treatment described above is loaded into an offset printing machine etc. and used for printing on multiple papers.

Hereinafter, the second aspect of the present invention is described.

The photosensitive layer of the planographic printing plate in the second aspect of the present invention is formed by applying and drying, on a support, a photosensitive layer coating solution in which a photosensitive composition containing a polymer insoluble in water but soluble in an aqueous alkali solution (hereinafter also called "a polymer soluble in an aqueous alkali solution") has been dissolved or dispersed in a solvent, and the residual solvent in the photosensitive layer thus formed should be 5% by weight or less relative to the total weight of the photosensitive layer.

The content of the residual solvent in the photosensitive layer is preferably 4% by weight or less, more preferably 3% by weight or less.

The amount of the residual solvent in the heat mode-compatible positive photosensitive layer as described in the above prior art is usually about 6 to 12%, but in the second aspect of the present invention, the residual solvent shall be limited to the above-described range by a method of using a low-boiling solvent as the solvent for preparation of the photosensitive layer coating solution or by a method of regulating the drying conditions after application of the photosensitive layer.

Examples of the solvent used in the photosensitive layer coating solution in the second aspect of the present invention are as follows. In the (round brackets), typical boiling point (° C.) is given. Examples include alcohols such as methanol (65.0), ethanol (78.5), n-propanol (97.3), isopropanol (82.3), n-butanol (117.7), isobutanol (108.3), 2-methyl-2-butanol (101.8), 2-ethyl-2-butanol (147), 2,4-dimethyl-3-pentanol (140), n-hexanol (160), cyclohexanol (161.1), 1-octanol (195.2) etc.; ethers such as dioxolane (74), methyl dioxolane (81), 3-methoxy-3-methyl butanol (174), 1-methoxy-2-propanol (120.6), dipropylene glycol monomethyl ether (190), tripropylene glycol monomethyl ether (243), propylene glycol monobutyl ether (170.2), propylene glycol monomethyl acetate (146), methyl carbitol (193.6), ethyl carbitol (202.8) etc.; ketones such as acetone (56), methyl ethyl ketone (79.6), methyl propyl ketone (102), methyl isobutyl ketone (115.1), methyl amyl ketone (151), diethyl ketone (102.8), 3-hydroxy-2-butanone (148), 4-hydroxy-2-butanone (182), cyclopentanone (129), cyclohexanone (155.4), diacetone alcohol (169.2) etc.; esters such as methyl lactate (144.8), ethyl lactate (157), butyl lactate (188), ethyl acetate (77), n-propyl acetate (102), isopropyl acetate (88.7), n-butyl acetate (126.6), methyl butyrate (102.3), ethyl butyrate (120), butyl butyrate (166.4), γ-butyrolactone (206), etc.; hydrocarbons such as n-hexane (68.7), cyclohexane (80.7), n-heptane (98.4), n-octane (125.7), toluene (110.6), xylene (139) etc.; and others such as water (100), dimethyl glycol (162) etc.

These solvents are used singly or in combination thereof. The solvent used is selected in consideration of the solubility, dispersibility etc. of the components used in the photosensitive composition, and the composition is dissolved or dispersed in a suitable solvent at a suitable concentration to prepare the photosensitive layer coating solution.

The concentration of the coating solution is not particularly limited, but is generally in the range of 2 to 50% by weight.

From the viewpoint of easier removal of the solvent after formation of the coating, the boiling point of the solvent is preferably 130° C. or less. However, a solvent having a boiling point of higher than 130° C. can also be preferably used by mixing it with a solvent having a boiling point of 130° C. or less. From the viewpoint of solubility, alcohols, ethers, ketones, esters etc. are preferable, and alcohols, ketones and esters are particularly preferable. From the viewpoints described above, preferable solvents include methanol, ethanol, isopropanol, dioxolane, 1-methoxy-2-propanol, ethyl acetate and γ-butyrolactone.

The photosensitive layer coating solution is applied onto the support and dried to form a photosensitive layer thereon, and the amount of the residual solvent in the photosensitive layer thus formed is measured preferably by gas chromatography.

The method of applying the photosensitive layer coating solution onto the support may be the same method as in the first aspect of the present invention described above.

The amount of the photosensitive layer applied is the same as in the first aspect of the present invention described above. In the planographic printing plate for heat-mode exposure in the second aspect of the present invention, the amount of the coated photosensitive layer after drying is in the range of 0.1 to 7 $g/cm^2$, preferably 0.2 to 5 $g/cm^2$, more preferably 0.5 to 3 $g/cm^2$.

After the photosensitive layer coating solution is applied, the drying temperature is preferably 80 to 200° C., more preferably 85 to 180° C., and most preferably 90 to 160° C. The drying time is 20 seconds to 5 minutes, preferably 25 seconds to 4 minutes, and more preferably 30 seconds to 3 minutes.

If the coating temperature is less than 80° C. or the drying time is less than 20 seconds, the residual solvent may remain in a large amount thereby lowering the sensitivity. On the other hand, even if the coating temperature is 200° C. or more or the drying time is 5 minutes or more, the effect of reducing the residual solvent is not increased in proportion to the energy consumed. The positive photosensitive layer in the second aspect of the present invention is free of components which are easily deteriorated particularly by heating, so there is no problem insofar as heating is within the upper limit of conventional heating temperature or heating time.

For sufficient removal of the solvent, a method of conducting the drying step twice or more under moderate conditions, or a method of drying under reduced pressure at 300 mmHg or less, can also be used.

Hereinafter, the photosensitive layer of the planographic printing plate in the second aspect of the present invention is described.

[Polymer Insoluble in Water but Soluble in an Aqueous Alkali Solution]

The major component for forming the photosensitive layer on the planographic printing plate in the second aspect of the present invention, that is, the polymer insoluble in water but soluble in an aqueous alkali solution, refers to a polymer having the following acid groups on the main chain or side chains thereof: a phenolic hydroxide group (—Ar—OH), carboxylic acid group (—$CO_2H$), sulfonic acid group (—$SO_3H$), phosphoric acid group (—$OPO_3H$), sulfonamide group (—$SO_2NH$—R), and substituted sulfonamide type acid groups (active imide groups) (—$SO_2NHCOR$, —$SO_2NHSO_2R$, and —$CONHSO_2R$).

Here, Ar represents a divalent aryl group which may have a substituent group, and R represents a hydrocarbon group which may have a substituent group.

Preferable acid groups among those described above include (a-1) phenolic hydroxyl group, (a-2) sulfonamide group and (a-3) active imide group, and in particular, (a-1) phenolic hydroxyl group-containing resin soluble in an aqueous alkaline solution (referred to hereinafter as "resin having a phenolic hydroxyl group") can be used most preferably.

The polymer having (a-1) phenolic hydroxyl group includes e.g. novolak resins such as a polycondensate of phenol and formaldehyde (referred to hereinafter as "phenol formaldehyde resin"), a polycondensate of m-cresol and formaldehyde (referred to hereinafter as m-cresol formaldehyde resin"), a polycondensate of p-cresol and formaldehyde, and a polycondensate of m- and p-cresol and formaldehyde, a polycondensate of phenol, m- and/or p-cresol and formaldehyde, and a polycondensate of pyrogallol and acetone. Alternatively, copolymers obtained by copolymerizing monomers having phenol groups in their side chains can also be used. These monomers having phenol groups include acrylamide, methacrylamide, acrylate, methacrylate and hydroxy styrene, which have phenol groups. Preferable examples include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl) methacrylamide, o-hydroxyphenyl acrylate, m-hydroxyphenyl acrylate, p-hydroxypheny acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, 2-(4-hydroxyphenyl)ethyl methacrylate, 2-(N'-(4-hydroxyphenyl) ureido) ethyl acrylate, 2-(N'-(4-hydroxyphenyl)ureido)ethyl methacrylate, etc.

Those polymers having weight average molecular weights of $5.0\times10^2$ to $2.0\times10^5$ or number average molecular weights of $2.0\times10^2$ to $1.0\times10^5$ are preferable in respect of image formability. Further, these resins may be used singly or in combination thereof. When these are used in combination, polycondensates of phenol having an alkyl group having 3 to 8 carbon atoms as substituent group and formaldehyde, for example a polycondensate of t-butyl phenol and formaldehyde and a polycondensate of octyl phenol and formaldehyde, may be used in combination.

As described in U.S. Pat. No. 4,123,279, condensates of phenol having an alkyl group having 3 to 8 carbon atoms as substituent group and formaldehyde, for example t-butyl phenol-formaldehyde resin and octyl phenol-formaldehyde resin, may also be used in combination. Such resins having phenolic hydroxyl group may be used singly or in combination thereof.

In the case of the alkali water-soluble polymer having (a-2) sulfonamide group, a monomer having (a-2) sulfonamide group, which is the main monomer constituting said polymer, includes low-molecular monomers each having at least one polymerizable unsaturated bond and a sulfonamide group having at least one hydrogen atom bound to the nitrogen atom thereof. Among these, those low-molecular compounds having acryloyl group, allyl group or vinyloxy group and substituted or mono-substituted aminosulfonyl group or substituted sulfonyl imino group are preferable.

Such compounds include those compounds represented by the following general formulae (1) to (5):

General formula (1)

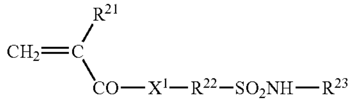

General formula (2)

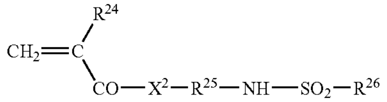

General formula (3)

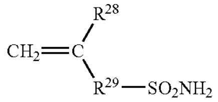

General formula (4)

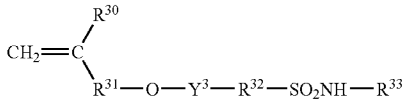

General formula (5)

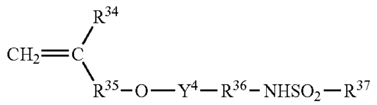

In the general formulae, $X^1$ and $X^2$ each represents —O—and -$NR^{27}$, $R^{21}$ and $R^{24}$ each represents a hydrogen atom and —$CH^3$, $R^{22}$, $R^{25}$, $R^{29}$, $R^{32}$ and $R^{36}$ each represents an alkylene group having 1 to 12 carbon atoms, cycloalkylene group, arylene group and aralkylene group, which may have a substituent group. $R^{23}$, $R^{27}$ and $R^{33}$ each represents a hydrogen atom, an alkyl group having 1 to 12 carbon atoms, cycloalkyl group, aryl group and aralkyl group, which may have a substituent group, $R^{26}$ and $R^{37}$ each represent an alkyl group having 1 to 12 carbon atoms, cycloalkyl group, aryl group, and aralkyl group, which may have a substituent group, $R^{28}$, $R^{30}$, and $R^{34}$ represent a hydrogen atom and —$CH_3$, $R^{31}$ and $R^{35}$ each represents an alkylene group having 1 to 12 carbon atoms, cycloalkylene group, arylene group and aralkylene group, which may have a single bond or a substituent group, $Y^3$ and $Y^4$ each represents a single bond and —CO—.

Specifically, m-aminosulfonyl phenyl methacrylate, N-(p-aminosulfonyl phenyl)methacrylamide, N-(p-aminosulfonyl phenyl) acrylamide etc. can be preferably used.

In the case of the alkali water-soluble polymer having (a-3) active imide group, the polymer has the active imide group of the following general formula in the molecule, and a monomer having (a-3) active imide group as the main monomer constituting said polymer is a monomer consisting of a low-molecular compound having at least one active imide group represented by the following general formula and at least one polymerizable unsaturated bond.

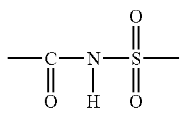

As these compounds, N-(p-toluene sulfonyl)methacrylamide, N-(p-toluene sulfonyl)acrylamide etc. can be preferably used.

As the alkali water-soluble copolymer usable in the second aspect of the present invention, those polymers obtained not only by polymerizing one monomer containing one of acidic groups (a-1) to (a-3) but also by copolymerizing two or more monomers containing the different acidic groups can be used.

The method of copolymerization may be those known in the art such as graft copolymerization, block copolymerization, random copolymerization etc. The copolymers described above contain those copolymerizable monomers having the acidic groups (a-1) to (a-3) as copolymer components in an amount of preferably 0.10 mol-% or more and more preferably 20 mol-% or more. If the amount of these copolymerizable components is less than 10 mol-%, the interaction with the resin having phenolic hydroxyl group becomes insufficient, and the effect of improving development latitude which is the advantage brought about by use of the copolymerizable components becomes insufficient.

Further, this copolymer may also contain copolymerizable components other than the monomers containing the acidic groups (a-1) to (a-3).

Examples of other monomers usable as the copolymer components include the monomers (1) to (12) below.

(1) Acrylates and methacrylates having aliphatic hydroxyl group, for example 2-hydroxyethyl acrylate and 2-hydroxyethyl methacrylate.

(2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, N-dimethylaminoethyl acrylate etc.

(3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, N-dimethyl aminoethyl methacrylate etc.

(4) Acrylamide, methacrylamide and analogues thereof, such as N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide etc.

(5) Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether etc.

(6) Vinyl esters such as vinyl acetate, vinyl chloroacetate, vinyl butyrate, vinyl benzoate etc.

(7) Styrene and analogues thereof, such as α-methyl styrene, methyl styrene, chloromethyl styrene etc.

(8) Vinyl ketones such as methyl vinyl ketone, ethyl vinyl ketone, propyl vinyl ketone, phenyl vinyl ketone etc.

(9) Olefins such as ethylene, propylene, isobutylene, butadiene, isoprene etc.

(10) N-vinyl pyrrolidone, N-vinyl carbazole, 4-vinyl pyridine, acrylonitrile, methacrylonitrile etc.

(11) Unsaturated imides such as maleimide, N-acryloyl acrylamide, N-acetyl methacrylamide, N-propionyl methacrylamide, N-(p-chlorobenzoyl) methacrylamide etc.

(12) Unsaturated carboxylic acids such as acrylic acid, methacrylic acid, maleic anhydride, itaconic acid etc.

For film strength, it is preferable that whether a homopolymer or a copolymer, the alkali water-soluble polymer in the second aspect of the present invention has a weight average molecular weight of 2000 or more and a number average molecular weight of 500 or more. More preferably, the weight average molecular weight is 5000 to 300000, the number average molecular weight is 800 to 250000, and the degree of dispersion (weight average molecular weight/number average molecular weight) is 1.1 to 10.

The ratio by weight of the monomers having the acidic groups (a-1) to (a-3): other monomers compounded in the copolymer described above is in the range of preferably from 50:50 to 5:95, and more preferably from 40 to 60 to 10:90.

The polymer having phenolic hydroxyl group preferable in the second aspect of the present invention includes novolak resins such as polycondensates of m- and p-cresol and formaldehyde and polycondensates of cresol and formaldehyde, N-(4-hydroxyphenyl)methacrylamide/methyl methacrylate/acrylonitrile copolymer, and 2-(N'-(4-hydroxyphenyl)ureido)ethyl methacrylate/methyl methacrylate/acrylonitrile copolymer.

As the preferable polymers in the second aspect of the present invention, the polymer having sulfonamide group preferably includes N-(p-aminosulfonyl phenyl)methacrylamide/methyl methacrylate/acrylonitrile copolymers etc., and the polymer having active imide group includes N-(p-toluene sulfonyl) methacrylamide/methyl methacrylate/acrylonitrile/2-hydroxyethyl methacrylate copolymers etc.

These alkali water-soluble polymers may be used singly or in combination thereof, and the polymers are used in an amount of 30 to 99% by weight, preferably 40 to 95% by weight, more preferably 50 to 90% by weight, relative to the solid content of the components forming the photosensitive layer. If the amount of the alkali-soluble polymer is less than 30% by weight, the durability of the photosensitive layer is deteriorated, whereas if the amount exceeds 99% by weight, the product is not preferable with respect to both sensitivity and durability.

[IR Absorber]

The planographic printing plate in the second aspect of the present invention may be subjected to heat-mode exposure as described above, but from the viewpoint of improving the sensitivity thereof to this exposure, an IR absorber is preferably contained in the photosensitive layer.

In the second aspect of the present invention, the IR absorber contained as necessary in the photosensitive layer may be any substance having the ability to convert light to heat thus generating heat upon exposure by an infrared laser, but from the viewpoint of the effect, the IR absorber is particularly preferably a dye or a pigment having a maximum absorption wavelength in the range of 760 to 1200 nm, and from the viewpoint of image formability, the dye is particularly preferably.

The same pigment as in the first aspect of the present invention can be used.

The dye may be any commercial dye including commercial dyes and known dyes described in literature (e.g. "Senryo Binran" (Dye Handbook) published in 1970 and compiled by Society of Synthetic Organic Chemistry, Japan). Examples of such dyes include azo dyes, metal complex salt azo dyes, pyrazolone azo dyes, anthraquinone dyes, phthalocyanine dyes, carbonium dyes, quinone imine dyes, methine dyes, cyanine dyes, diimonium dyes and aminium dyes.

Among these pigments or dyes in the second aspect of the present invention, those absorbing infrared rays or near infrared rays are particularly preferable with respect to suitability for use in a laser for emitting infrared rays or near infrared rays.

As a pigment absorbing such infrared rays or near infrared rays, carbon black is preferably used. Other dyes absorbing infrared rays or near infrared rays include the cyanine dyes described in JP-A No. 58-125246, JP-A No. 59-84356, JP-A No. 59-202829, JP-A No. 60-78787 etc., the methine dyes described in JP-A No. 58-173696, JP-A No. 58-181690, JP-A No. 58-194595 etc., the naphthoquinone dyes described in JP-A No. 58-112793, JP-A No. 58-224793, JP-A No. 59-48187, JP-A No. 59-73996, JP-A No. 60-52940, JP-A No. 60-63744 etc., the squarylium dyes described in JP-A No. 58-112792 etc., the cyanine dyes described in GB Patent No. 434,875, and dihydropyrimidine squarylium dyes described in U.S. Pat. No. 5,380,635.

Further, the near infrared-absorbing sensitizer described in U.S. Pat. No. 5,156,938 is used preferably as the dye. Also preferably used are the aryl benzo(thio)pyrylium salts described in U.S. Pat. No. 3,881,924, the trimethine thiopyrylium salts described in JP-A No. 57-142645 (U.S. Pat. No. 4,327,169), the pyrylium type compounds described in JP-A No. 58-181051, JP-A No. 58-220143, JP-A No. 59-41363, JP-A No. 59-84248, JP-A No. 59-84249, JP-A No. 59-146063 and JP-A No. 59-146061, the cyanine dyes described in JP-A No. 59-216146, the pentamethine thiopyrylium salts described in U.S. Pat. No. 4,283,475, and the pyrylium compounds disclosed in JP-B No. 5-13514 and JP-B No. 5-19702. Epolight III-178, Epolight III-130, Epolight III-125, Epolight IV-62A etc. available from Epoline Co. Ltd. are particularly preferably for use as commercial products.

Particularly preferable examples of the dyes include the cyanine dyes represented by the following general formula (6):

General formula (6)

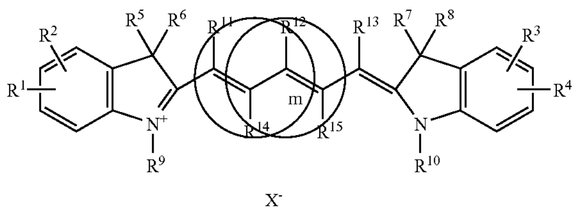

The above compounds have an absorption range in the infrared range of 700 nm to 1200 nm, are excellent in compatibility with the alkali water-soluble polymer, are basic dyes, and have intramolecular groups such as ammonium group and iminium group which interact with the alkali-soluble polymer, thus being capable of interacting with said polymer to regulate its solubility in alkali water, and therefore they can be preferably used in the second aspect of the present invention.

In the general formula (6) above, $R^1$ to $R^4$ independently represent a hydrogen atom, an alkyl group having 1 to 12 carbon atoms, alkenyl group, alkoxy group, cycloalkyl group and aryl group, which may have a substituent group, and $R^1$ and $R^2$, or $R^3$ and $R^4$, may be combined to form a ring structure. Specifically, $R^1$ to $R^4$ each represents a hydrogen atom, methyl group, ethyl group, phenyl group, dodecyl group, naphthyl group, vinyl group, allyl group, cyclohexyl group etc. When these groups have substituent groups, the substituent groups include a halogen atom, carbonyl group, nitro group, nitrile group, sulfonyl group, carboxyl group, carboxylate, sulfonate etc.

$R^5$ to $R^{10}$ independently represent an alkyl group having 1 to 12 carbon atoms which may have a substituent group. Specifically, $R^5$ to $R^{10}$ each represent a methyl group, ethyl group, phenyl group, dodecyl group, naphthyl group, vinyl group, allyl group, cyclohexyl group etc. When these groups have substituent groups, examples of the substituent groups include a halogen atom, carbonyl group, nitro group, nitrile group, sulfonyl group, carboxyl group, carboxylate, sulfonate etc.

$R^{11}$ to $R^{13}$ independently represent a hydrogen atom, a halogen atom, and an alkyl group having 1 to 8 carbon atoms which may have a substituent group, whereupon $R^{12}$ may be combined with $R^{11}$ or $R^{13}$ to form a ring structure, and when m is greater than 2, plural $R^{12}$ groups may be combined to form a ring structure. Specifically, $R^{11}$ to $R^{13}$ each represent a chlorine atom, a cyclohexyl group, and a cyclopentyl or cyclohexyl ring consisting of $R^{12}$ groups bound therein. When these groups have substituent groups, examples of the substituent groups include a halogen atom, carbonyl group, nitro group, nitrile group, sulfonyl group, carboxyl group, carboxylate, sulfonate etc. Further, m is an integer of 1 to 8, preferably 1 to 3.

$R^{14}$ and $R^{15}$ independently represent a hydrogen atom, a halogen atom, an alkyl group having 1 to 8 carbon atoms which may have a substituent group, and $R^{14}$ and $R^{15}$ may be combined to form a ring structure, and when m is greater than 2, plural $R^{14}$ groups may be mutually combined to form a ring structure. Specifically, $R^{14}$ to $R^{15}$ each represents a chlorine atom, a cyclohexyl group, and a cyclopentyl or cyclohexyl ring consisting of $R^{14}$ groups bound therein. When these groups have substituent groups, examples of the substituent groups include a halogen atom, carbonyl group, nitro group, nitrile group, sulfonyl group, carboxyl group, carboxylate, sulfonate etc. Further, $m^-$ is an integer of 1 to 8, preferably 1 to 3.

In the general formula (6) above, the anions represented by X—include e.g. perchloric acid, tetrafluoroboric acid, hexafluorophosphoric acid, triisopropyl naphthalene sulfonic acid, 5-nitro-o-toluene sulfonic acid, 5-sulfosalicylic acid, 2,5-dimethyl benzene sulfonic acid, 2,4,6-trimethyl beuzene sulfonic acid, 2-nitrobenzene sulfonic acid, 3-chlorobenzene sulfonic acid, 3-bromobenzene sulfonic acid, 2-fluorocapryl naphthalene sulfonic acid, dodecyl benzene sulfonic acid, 1-naphthol-5-sulfonic acid, 2-methoxy-4-hydroxy-5 -benzoyl-benzene sulfonic acid, and p-toluene sulfonic acid. Among these, alkyl aromatic sulfonic acids such as hexafluorophosphoric acid, triisopropyl naphthalene sulfonic acid and 2,5-dimethyl benzene sulfonic acid are particularly preferable. If anionic substituent groups are present on $R^1$ to $R^{15}$, $X^-$ may not be present.

These IR absorbers can be added in an amount of 0.01 to 50% by weight, preferably 0.1 to 20% by weight, more preferably 0.5 to 15% by weight, relative to the total solid in the photosensitive composition. If they are added in an amount of less than 0.01%, the effect of improving sensitivity cannot be achieved, whereas if they are added in an amount of more than 50% by weight, it is possible that the uniformity of the photosensitive layer is lost, the durability of the photosensitive layer is lowered, and the non-image portion is stained.

Along with other components, these dyes or pigments may be added to the photosensitive layer coating solution to form the photosensitive layer, or to a layer other than the photosensitive layer which is separately provided in preparing the planographic printing plate. These dyes or pigments may be used singly or as a mixture thereof.

[Other Components]

A variety of additives can be added as necessary to the photosensitive layer of the planographic printing plate in the second aspect of the present invention. For example, other onium salts, aromatic sulfone compounds, aromatic sulfonates, multifunctional amine compounds etc. are preferably added because these compounds can improve the function of preventing the alkali water-soluble polymer from being dissolved in the developing solution.

The onium salts include diazonium salts, ammonium salts, phosphonium salts, iodonium salts, sulfonium salts, selenonium salts, arsonium salts etc. Examples of the onium salts preferably used in the second aspect of the present invention include the diazonium salts described in S. I. Schlesinger, Photogr. Sci. Eng., 18, 387 (1974), T. S. Bal et al., Polymer, 21,423 (1980), and JP-A No. 5-158230, the ammonium salts described in U.S. Pat. Nos. 4,069,055 and 4,069,056 and JP-A No. 3-140140, the phosphonium salts described in D. C. Necker et al., Macromolecules, 17, 2468 (1984), C. S. Wen et al., Teh, Proc. Conf. Rad. Curing ASIA, p. 478, Tokyo, October (1988), U.S. Pat. Nos. 4,069,055 and 4,069,056, the iodonium salts described in J. V. Crivello et al., Macromolecules, 10(6), 1307 (1977), Chem. & Eng. News, November 28, p. 31 (1988), EP Patent No. 104,143, U.S. Pat. Nos. 339,049 and 410,201, JP-A No. 2-150848 and JP-A No. 2-296514, the sulfonium salts described in J. V. Crivello et al., Polymer J. 17, 73 (1985), J. V. Crivello et al. J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14(5), 1141 (1981), J. V. Crivello et al., J. Polymer Sci., Polymer Chem. Ed., 17, 2877 (1979), EU Patent Nos. 370,693, 233,567, 297,443 and 297,442, U.S. Pat. Nos. 4,933,377, 3,902,114, 410,201, 339,049, 4,760,013, 4,734,444 and 2,833,827, and German Patent Nos. 2,904,626, 3,604,580 and 3,604,581, the selenium salts described in J. V. Crivello et al., Macromolecules, 10(6), 1307 (1977) and J. V. Crivello et al., J. Polymer Sci., Polymer Chem. Ed., 17, 1047 (1979), and the arsonium salts described in C. S. Wen et al., Teh, Proc. Conf. Rad. Curing ASIA, p. 478, Tokyo, October (1988).

Counter ions for the onium salts include tetrafluorobonc acid, hexafluorophosphoric acid, triisopropyl naphthalene sulfonic acid, 5-nitro-o-toluene sulfonic acid, 5-sulfosalicylic acid, 2,5-dimethyl benzene sulfonic acid, 2,4,6-trimethyl benzene sulfonic acid, 2-nitrobenzene sulfonic acid, 3-chlorobenzene sulfonic acid, 3-bromobenzene sulfonic acid, 2-fluorocapryl naphthalene sulfonic acid, dodecyl benzene sulfonic acid, 1 -naphthol-5-sulfonic acid, 2-methoxy-4-hydroxy-5-benzoyl-benzene sulfonic acid, and p-toluene sulfonic acid.

Among these, alkyl aromatic sulfonic acids such as hexafluorophosphoric acid, triisopropyl naphthalene sulfonic acid and 2,5-dimethyl benzene sulfonic acid are particularly preferable.

The onium salts described above are added in an amount of preferably 0.1 to 50% by weight, more preferably 0.5 to 30% by weight and most preferably 1 to 10% by weight relative to the total solid content of the materials constituting the photosensitive layer.

Further, cyclic acid anhydrides, phenols and organic acids can also be used in combination for the purpose of improving sensitivity. The cyclic acid anhydrides include those described in U.S. Pat. No. 4,115,128, such as phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride and pyromellitic anhydride. The phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenyl methane, and 4,4',3",4"-tetrahydroxy-3,5,3',5'-tetramethyl triphenyl methane. The organic acids include those described in JP-A No. 60-88942 and JP-A No. 2-96755, such as sulfonic acids, sulfinic acids, alkyl sulfuric acids, phosphonic acids, phosphates and carboxylic acids, and specifically, mention is made of p-toluene sulfonic acid, dodecyl benzene sulfonic acid, p-toluene sulfinic acid, ethyl sulfuric acid, phenyl phosphonic acid, phenyl phosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid.

The amount of the cyclic acid anhydrides, phenols and organic acids described above, in terms of the solid content thereof, is preferably 0.05 to 20% by weight, more preferably 0.1 to 15% by weight and most preferably 0.1 to 10% by weight.

For improvement of treatment stability under development conditions, nonionic surfactants such as those described in JP-A No. 62-251740 and JP-A No. 3-208514 and amphoteric surfactants such as those described in JP-A No. 59-121044 and JP-A No. 4-13149 can be added to the photosensitizer layer in the second aspect of the present invention.

Examples of the nonionic surfactants include sorbitan tristearate, sorbitan monopalmitate, sorbitan trioleate, stearate monoglyceride, polyoxyethylene nonyl phenyl ether etc.

Examples of the amphoteric surfactants include alkyl di(aminoethyl)glycine, alkyl polyaminoethyl glycine hydrochloride, 2-alkyl-N-carboxyethyl-N-hydroxyethyl imidazolium betaine and N-tetradecyl-N,N-betaine type surfactants (e.g. Amogen K™, Dai-Ichi Kogyo Co., Ltd.).

The amount of the nonionic surfactants and amphoteric surfactants in the photosensitive layer is preferably 0.05 to 15% by weight, more preferably 0.1 to 5% by weight.

Surfactants for improving coating properties, for example the fluorine type surfactants described in JP-A No. 62-170950, can be added to the photosensitive layer coating solution in the second aspect of the present invention. The amount of the surfactant added is preferably 0.01 to 1% by weight, more preferably 0.05 to 0.5% by weight.

A print-out agent for obtaining a visible image immediately after heating by exposure and a dye or a pigment as the coloring agent for the image can be added to the photosensitive layer in the second aspect of the present invention.

A typical example of the print-out agent include combination of a compound releasing an acid upon heating by exposure (optical acid-releasing agent) and an organic dye capable of forming a salt. Specific examples include those combinations of o-naphthoquinone diazide-4-sulfonate halogenides and salt-forming organic dyes as described in JP-A No. 50-36209 and JP-A No. 53-8128, and those combinations of trihalomethyl compounds and salt-forming organic dyes as described in JP-A No. 53-36223, JP-A No. 54-74728, JP-A No. 60-3626, JP-A No. 61-143748, JP-A No. 61-151644 and JP-A No. 63-58440. Such trihalomethyl compounds include oxazole type compounds and triazine type compounds, both of which are excellent in stability with time and give clear printed images.

The coloring agent for the image can make use of other dyes besides the salt-forming organic dyes described above. Examples of preferable dyes including the salt-forming organic dyes, include oil-soluble dyes and basic dyes. Specifically, examples include Oil Yellow #101, Oil Yellow #103, Oil Pink #312, Oil Green BG, Oil Blue BOS, Oil Blue #603, Oil Black BY, Oil Black BS, Oil Black T-505 (which are available from Orient Kagaku Kogyo Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015) etc. Further, the dyes described in JP-A No. 62-293247 are particularly preferable. These dyes can be added to the photosensitive layer in an amount of 0.01 to 10% by weight, preferably 0.1 to 3% by weight relative to the total solid content of the photosensitive layer.

Further, a plasticizer for conferring flexibility etc. on the coating is added as necessary to the photosensitive layer in the second aspect of the present invention. For example, butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and acrylic acid or methacrylic acid oligomers and polymers are used.

In addition, epoxy compounds, vinyl ethers, and the phenol compounds having hydroxy methyl group described in JP-A No. 8-276558, phenol compounds having alkoxy methyl group, and crosslinking compounds previously proposed by the present inventors having the action of inhibiting dissolution in an alkali described in JP-A No. 11-160860 can be added as necessary depending on the intended object.

The planographic printing plate in the second aspect of the present invention can be produced by coating a suitable support with the photosensitive layer coating solution or with a solution prepared by dissolving, in a solvent, the desired coating components in the protective layer etc. The coating solvent for the photosensitive layer is as described above, but depending on the components used, the solvent for the protective layer and the back coat layer can be suitably selected from the known solvents.

The support used in the planographic printing plate in the second aspect of the present invention can be the same support as in the first aspect of the present invention.

The surface of the support can be subjected to surface-roughing treatment, anodizing treatment and hydrophilicity-conferring treatment in the same manner as in the first aspect of the present invention.

The planographic printing plate in the second aspect of the present invention comprises the support provided thereon with the positive photosensitive layer containing a photosensitive composition, and if necessary, a prime coat may be provided between the support and the photosensitive layer.

The prime-coat components may be various organic compounds such as carboxymethyl cellulose, dextrin, gum arabic, phosphonic acids having amino group, such as 2-aminoethyl phosphonic acid, optionally substituted organic phosphonic acids such as phenyl phosphonic acid, naphthyl phosphonic acid, alkyl phosphonic acid, glycerophosphonic acid, methylene diphosphonic acid and ethylene diphosphonic acid, optionally substituted organic phosphoric acids such as phenyl phosphoric acid, naphthyl phosphoric acid, alkyl phosphoric acid and glycerophosphoric acid, optionally substituted organic phosphinic acids such as phenyl phosphinic acid, naphthyl phosphinic acid, alkyl phosphinic acid and glycerophosphinic acid, amino acids such as glycine and β-alanine, and hydroxyl group-containing amine hydrochlorides such as triethanolamine hydrochloride, and these may be used in combination thereof.

This organic prime coat can be provided by a method in which a solution of the above-described organic compounds in water, in an organic solvent such as methanol, ethanol or methyl ethyl ketone or in a mixed solvent thereof is applied and dried on an aluminum plate, or by a method in which an aluminum plate is dipped in a solution of the above-described organic compounds in water, in an organic solvent such as methanol, ethanol or methyl ethyl ketone or in a mixed solvent thereof, thus permitting the above-described compounds to be adsorbed onto the plate which is then washed with water etc. and dried to provide an organic prime coat thereon. In the former method, a solution of the above-described compounds at a concentration of 0.005 to 10% by weight can be applied in various methods. In the latter method, the concentration of the solution is 0.01 to 20% by weight, preferably 0.05 to 5% by weight, the dipping temperature is 20 to 90° C., preferably 25 to 50° C., and the dipping time is 0.1 second to 20 minutes, preferably 2 seconds to 1 minute. This solution may be adjusted in the range of pH 1 to 12 with basic materials such as ammonia, triethylamine and potassium hydrochloride or acidic materials such as hydrochloric acid and phosphoric acid. In addition, yellow dyes can also be added for improvement of the tone reproducibility of the image recording material.

The amount of the organic prime coat applied is suitably 2 to 200 mg/m$^2$, preferably 5 to 100 mg/m$^2$. If the amount of the prime coat applied is less than 2 mg/m$^2$, satisfactory printing resistance performance cannot be achieved. This applies to an amount of higher than 200 mg/m$^2$.

The positive planographic printing plate prepared in the manner described above is usually subjected to image exposure and development treatment.

The light source of actinic rays used in exposure includes a solid laser, a semiconductor laser etc. for emitting infrared rays at a wavelength of 760 to 1200 nm.

In the second aspect of the present invention, a light source having an emission wavelength ranging from the near infrared to infrared range is preferable, and a solid laser and a semiconductor laser are particularly preferable.

The developing solution and the replenishing solution for the planographic printing plate in the second aspect of the present invention may be aqueous alkali solutions known in the art. Examples include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Further, use is made of organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, and pyridine.

These alkali agents are used singly or in combination thereof.

Those particularly preferable developing solutions among the alkali agents described above are aqueous solutions of sodium silicate, potassium silicate etc. This is because the developing properties can be regulated by the ratio of the silicon oxide $SiO_2$ to the alkali metal oxide $M_2O$ which are components in the silicate or by the concentration thereof. For example, the alkali metal silicates described in JP-A No. 54-62004 and JP-B No. 57-7427 can be used effectively.

It is also known that when the development is conducted in an automatic developer, an aqueous solution of higher alkali strength than in the developing solution is added to the developing solution, whereby a number of PS prints can be treated without replacing the developing solution in the development tank with fresh solution for a long time. This system of replenishing the solution can also be preferably applied to the second aspect of the present invention. For the purpose for promoting and suppressing the developing properties, for dispersing development residues and for improving the affinity of the image portion of on the printing plate for ink, various surfactants and organic solvents can be added as necessary to the developing solution and the replenishing solution. Preferable surfactants include anionic, cationic, nonionic and amphoteric surfactants.

Reducing agents such as hydroquinone, resorcin, sodium or potassium salts etc. of inorganic acids such as sulfurous acid and hydrogensulfinic acid, organic carboxylic acids, defoaming agents and hard-water softeners, can also be added as necessary to the developing solution and the replenishing solution.

The printing plate which was subjected to development treatment with the developing solution and the replenishing solution is post-treated with washing water, a surfactant-containing rinse, and an desensitizing greasing solution containing gum arabic and starch derivatives. These treatments can be used in combination as the post-treatment for the planographic printing plate in the second aspect of the present invention.

In the industrial fields of plate making and printing, an automatic developing machine for printing plate has been widely used in recent years for rationalization and standardization of the plate making operation. This automatic developing machine consists generally of a developing section, a post-treatment section, a device for transferring a printing plate, a bath of each of the treating solutions and a spraying device, and while a printing plate which has been exposed is transferred horizontally, the treating solution drawn by a pump is sprayed through a spray nozzle to thereby carry out development of the printing plate. Recently, a method of dip-treating a printing plate in a treating solution bath filled with a treating solution while transferring it by use of guide rolls into the solution has become known. Such automatic treatment can be carried out by adding to each of the treatment solutions replenishing solution, depending on throughput, operation time etc.

The so-called "throwaway" treatment system of treatment with a substantially virgin treating solution can also be applied.

If there is an unnecessary image portion (e.g., a trace of the edge of an original-picture film) on the planographic printing plate obtained by image exposure, development, washing with water and/or rinsing and/or gum coating treatment, the unnecessary image portion is removed. For such removal, a method of applying a removal solution onto the unnecessary image part, then leaving it for a predetermined time and washing it with water as described in e.g. JP-B No. 2-13293 is preferable, but a method of exposing the unnecessary image part with actinic rays guided by an optical fiber followed by development, as described in JP-A No. 59-174842, can also be utilized.

The planographic printing plate thus obtained can be coated with a desensitizing gum as necessary and then subjected to printing, but if the planographic printing plate with higher printing resistance is desired, it is subjected to burning treatment.

The same burning treatment as in the first aspect of the present invention can be carried out.

Generally, the amount of the baking conditioner applied is preferably 0.03 to 0.8 $g/m^2$ (dry weight).

The planographic printing plate coated with the baking conditioner is dried as necessary and then heated at high temperatures by a burning processor (e.g. a burning processor BP-1300 from Fuji Photo Film Co., Ltd.). In this case, the heating temperature and time are varied depending the type of components forming the image, but are preferably 180 to 300° C. and 1 to 20 minutes.

After the burning treatment, the planographic printing plate can be subjected to conventional treatments such as washing with water and gum coating treatment as necessary, but if a baking conditioner containing water-soluble polymers etc. is used, the so-called desensitizing treatment such as gum coating treatment can be eliminated.

The planographic printing plate obtained in the treatments described above is loaded onto an offset printing machine etc. and used for printing on multiple sheets of paper.

EXAMPLES

Hereinafter, the present invention is described by reference to the Examples, which however are not intended to limit the present invention.

Examples 1 to 3 and Comparative Examples 1 and 2

[Preparation of a Support]

After an aluminum plate (material 1050) of 0.3 mm in thickness was degreased by washing it with trichloroethylene, the surface thereof was roughened with a nylon brush and a suspension of 400 mesh pumice stone powder in water and washed sufficiently with water. This plate was etched by dipping it for 9 seconds in 25% aqueous sodium hydroxide at 45° C., then washed with water, dipped for 20 seconds in 2% aqueous $NHO_3$, and washed with water. The amount of the roughened surface thus etched was about 3 $g/m^2$. Then, this plate was coated with a 3 $g/m^2$ AC anodized film in an electrolyte of 7% $H_2SO_4$ at current density of 15 $A/dm^2$. Thereafter, the plate was dipped for 1 minute in 2.5% aqueous sodium silicate at 70° C., washed with water, and dried. Then, this aluminum plate was coated with a prime-coating solution 1 with the following composition and then dried at 80° C. for 30 seconds to give a support. The amount of the applied prime-coating solution 1 after drying was 20 mg/$m^2$.

| <Prime-coating solution 1> | |
|---|---|
| Dibutyl naphthalene sulfonic acid as a condensate of 4-diazodiphenyl amine, phenoxyacetic acid and formaldehyde (literal trans.) | 0.1 g |
| Methanol | 100 g |

The following photosensitive layer coating solution 1 was applied in an amount of 1.5 g/$m^2$ onto the support prepared in the manner described above, and then dried at 120° C. for 1 minute.

| <Photosensiyive layer coating solution 1> | |
|---|---|
| Pentaerythritol tetraacrylate | 1.5 g |
| Allyl methacrylate/methacrylic acid copolymer (polymerization molar ratio 83/17; Mw 100,000) | 2.0 g |
| IR absorber DX-1 (with the structure below) | 0.1 g |
| Polymerization initiator SX-1 (with the structure below) | 0.2 g |
| Fluorine-type nonionic surfactant (Megafac F-177, Dainippon Ink and Chemicals, Inc.) | 0.02 g |
| Victoria Pure Blue | 0.04 g |
| Solvent (shown in Table 1 below) | 27 g |

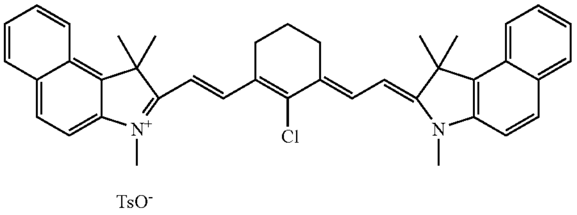

DX-1

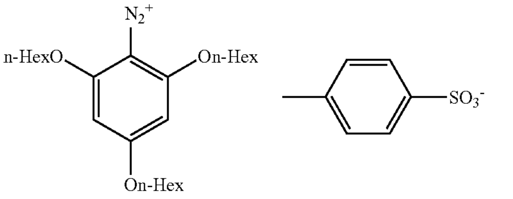

SX-1

TABLE 1

| | Solvent used (boiling point) |
|---|---|
| Example 1 | Methanol (65.0° C)/methyl ethyl ketone (80° C.)/ 1-methoxy-2-propanol (118° C.) Mixing ratio (1/1/1) |
| Example 2 | Acetonitrile (81.6° C.)/methanol (65.0° C.) Mixing ratio (1/1) |
| Example 3 | Acetonitrile (81.6° C.)/methyl ethyl ketone (80° C.) Mixing ratio (1/2) |
| Comparative Example 1 | Dimethyl sulfoxide (189° C.) |
| Comparative Example 2 | Dimethyl formamide (153° C.) |

[Measurement of Residual Solvent and Sensitivity]

The resulting planographic printing plate was exposed at a major scanning speed of 5 m/sec. by means of a semiconductor laser with a power output of 500 mW, a wavelength of 830 nm, a beam diameter of 17 μm (1/$e^2$) and then developed in an automatic developing machine (PS Processor 900VR, Fuji Photo Film Co., Ltd.) fed with a developing solution DN3C (diluted at 1:2 with water) produced by Fuji Photo Film Co., Ltd. and evaluated in the following manner. On the basis of the line width of the resulting image, the laser power output, the loss in the optical system, and the scanning speed, the amount of energy necessary for recording was calculated and used as sensitivity. The results are shown in Table 2.

The weight of the planographic printing plate after application and drying of the photosensitive layer coating solution was measured, and then the weight thereof after drying under reduced pressure at 0.5 mmHg at 40° C. for 24 hours was measured, and from the reduction in its weight, the residual solvent (% by weight) in the photosensitive layer was calculated. The results are shown in Table 2.

TABLE 2

| | Amount of residual solvent (%) | Sensitivity (mJ/$cm^2$) |
|---|---|---|
| Example 1 | 3.1 | 100 |
| Example 2 | 2.7 | 110 |
| Example 3 | 3.2 | 100 |
| Comparative Example 1 | 8.1 | 140 |
| Comparative Example 2 | 7.4 | 135 |

From the results in Table 2, it can be understood that even in the photosensitive layer containing the same components, the sensitivity can be improved by reducing the amount of the residual solvent by use of the low-boiling solvent.

Examples 4 to 6 and Comparative Example 3

The planographic printing plates were formed in the same manner as in Example 1 except that 1.5 g/$m^2$ of the following photosensitive layer coating solution 2 was applied in place of the photosensitive layer coating solution 1, and each planographic printing plate was dried at 120° C. for the time shown in Table 3.

| <Photosensitive layer coating solution 2> | |
|---|---|
| Glycerin dimethacrylate hexamethylene diisocyanate prepolymer | 1.5 g |
| Polyurethane resin as a polycondensate of diisocyanate and diol (i.e., 4,4'-diphenyl methane diisocyanate/hexamethylene diisocyanate/polypropylene glycol (polymerization average molecular weight 1,000, PPG1000)/2,2-bis(hydroxymethyl) propionic acid copolymer, molar ratio (40/10/15/35)) | 2.0 g |
| IR absorber DX-1 | 0.1 g |
| Polymerization initiator SX-2 (the structure below) | 0.2 g |
| Fluorine-type nonionic surfactant (Megafac F-177, Dainippon Ink and Chemicals, Inc.) | 0.02 g |
| Victoria Pure Blue | 0.04 g |
| Dimethyl formamide (b.p.: 153° C.) | 27 g |

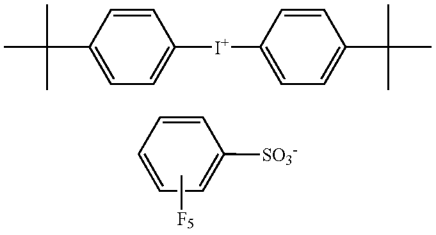

SX-2

Each of the planographic printing plates thus obtained was measured for sensitivity and residual solvent in the photosensitive layer in the same manner as in Example 1. The results are shown in Table 3.

TABLE 3

| | Drying time (sec) | Amount of residual solvent (%) | Sensitivity (mJ/$cm^2$) |
|---|---|---|---|
| Example 4 | 90 | 4.8 | 115 |
| Example 5 | 120 | 4.2 | 105 |
| Example 6 | 150 | 3.8 | 105 |
| Comparative Example 3 | 60 | 7.4 | 135 |

From the results in Table-3, it can be understood that in the photosensitive layer containing the same components, the sensitivity can be improved by reducing the amount of the residual solvent by regulating the drying conditions of the solvent.

Examples 7 and 8

The planographic printing plates were formed in the same manner as in Example 1 except that 1.5 g/$m^2$ of the following photosensitive layer coating solution 3 was applied in place of the photosensitive layer coating solution 1, and then 3% by weight aqueous polyvinyl alcohol (98 mole-% saponification, polymerization of 550) was applied thereon such that its amount after drying was 2 g/$m^2$, and dried at 100° C. for 1 minute to provide a protective layer thereon.

| <Photosensitive layer coating solution 3> | |
|---|---|
| Binder polymer (allyl acrylate/methacrylic acid/N-isopropyl amide copolymer (67/13/20)) | 2.0 g |
| Monomer: a polymerizable compound (pentaerythritol tetraacrylate) | 1.0 g |
| IR absorber DX-1 | 0.1 g |
| Polymerization initiator SX 2 | 0.2 g |
| Fluorine-type nonionic surfactant (Megafac F-177, Dainippon Ink and Chemicals, Inc.) | 0.02 g |
| Victoria Pure Blue | 0.04 g |
| Solvent (shown in Table 4 below) | 27 g |

TABLE 4

| | Solvent used (boiling point) |
|---|---|
| Example 7 | Methanol (65.0° C.)/methyl ethyl ketone (80° C.)/1-methoxy-2-propanol (118° C.) Mixing ratio (1/1/1) |
| Example 8 | Acetonitrile (81.6° C.)/ethanol (78.5° C.) Mixing ratio (1/1) |
| Comparative Example 4 | Dimethyl sulfoxide (189° C.) |

Each of the planographic printing plates thus obtained was measured for sensitivity and residual solvent in the photosensitive layer in the same manner as in Example 1. The results are shown in Table 5.

TABLE 5

| | Amount of residual solvent (%) | Sensitivity (mJ/$cm^2$) |
|---|---|---|
| Example 7 | 3.2 | 90 |
| Example 8 | 3.0 | 85 |
| Comparative Example 4 | 7.6 | 125 |

From the results in Table 5, it can be understood that even if the photosensitive layer is provided with a protective layer, the sensitivity can be improved in the same way as the photosensitive layer not provided with a protective layer by reducing the amount of the residual solvent by use of a low-boiling solvent.

Examples 9 and 11

The planographic printing plates formed by applying and drying a photosensitive layer in the same manner as in Examples 1 to 3 were further heated for 2 minutes under the temperature condition of 80° C. to give the planographic printing plates in Examples 9 to 11 respectively.

Each of the planographic printing plates thus obtained was measured for sensitivity and residual solvent in the photosensitive layer in the same manner as in Example 1. The results are shown in Table 6.

TABLE 6

| | Amount of residual solvent (%) | Sensitivity (mJ/cm$^2$) |
|---|---|---|
| Example 9 | 1.8 | 90 |
| Example 10 | 1.5 | 85 |
| Example 11 | 1.8 | 90 |

From the results in Table 6, it can be understood that when the drying step was conducted twice, the residual solvent can be further reduced and the sensitivity can be further improved as compared with Examples 1 to 3 where the drying step was conducted once.

Examples 12 and 13

The planographic printing plates formed by applying and drying a photosensitive layer in the same manner as in Examples 7 and 8 were further heated for 2 minutes under the temperature condition of 80° C. to give the planographic printing plates in Examples 12 and 13 respectively.

Each of the planographic printing plates thus obtained was measured for its sensitivity and the residual solvent in the photosensitive layer in the same manner as in Example 1. The results are shown in Table 7.

TABLE 7

| | Amount of residual solvent (%) | Sensitivity (mJ/cm$^2$) |
|---|---|---|
| Example 12 | 1.8 | 80 |
| Example 13 | 1.8 | 80 |

From the results in Table 7, it can be understood that when the drying step was conducted twice, the residual solvent can be further reduced and the sensitivity can be further improved as compared with Examples 7 and 8 where the drying step was conducted once.

According to the present invention, the planographic printing plate having a highly sensitive negative photosensitive layer capable of being written by an infrared laser can be provided by regulating the residual solvent in the photosensitive layer.

Example 14

[Preparation of a Support]

After an aluminum plate (material 1050) of 0.3 mm in thickness was degreased by washing it with trichloroethylene, the surface thereof was roughened with a nylon brush and a suspension of 400 mesh pumice stone powder in water and washed sufficiently with water. This plate was etched by dipping it for 9 seconds in 25% aqueous sodium hydroxide at 45° C., then washed with water, dipped for 20 seconds in 2% nitric acid, and washed with water. The amount of the roughened surface thus etched was about 3 g/m$^2$. Then, this plate was coated with a 3 g/m$^2$ AC anodized film in an electrolyte of 7% sulfuric acid at an current density of 15 A/dm$^2$, then washed with water and dried to give support A. Support A was coated with a prime-coating solution 2 below and then dried at 90° C. for 1 minute to give support B. The amount of the applied coating after drying was 10 mg/m$^2$.

| <Prime-coating solution 2> | |
|---|---|
| β-Alanine | 0.5 g |
| Methanol | 95 g |
| Water | 5 g |

The following photosensitive layer coating solution 4 was applied in an amount of 1.6 g/m$^2$ onto the resulting support to give the planographic printing plate in Example 14. The photosensitive layer was dried at 110° C. for 60 seconds at normal pressures in an oven equipped with an exhaust duct.

| <Composition of the photosensitive layer coating solution 4> | |
|---|---|
| m, p-Cresol novolak (with a m/p ratio = 6/4, a weight average molecular weight of 3500 and an unreacted cresol content of 0.5% by weight) (alkali water-soluble polymer) | 1.0 g |
| IR absorber (with the structure below) | 0.2 g |
| Victoria Pure Blue wherein the counterion BOH was replaced by 1-naphthalene sulfonate anion | 0.02 g |
| Fluorine-type surfactant (Megafac F-177, Dainippon Ink and Chemicals, Inc.) | 0.05 g |
| Solvent (methyl ethyl ketone) | 18 g |

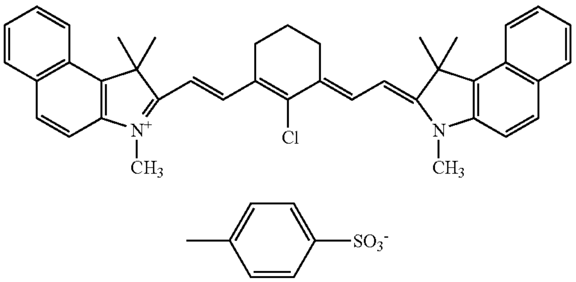

Examples 15 to 23 and Comparative Examples 5 to 7

The planographic printing plates in Examples 15 to 23 and Comparative Examples 5 to 7 were formed in the same manner as in Example 14 except that the type of the solvent incorporated into the photosensitive layer coating solution 4 and the drying conditions after application of the photosensitive layer coating solution were changed as shown in Table 8 below.

In the following tables, the solvents are abbreviated as follows:

MEK: Methyl ethyl ketone (boiling point: 79.6° C.)
MFG: 1-Methoxy-2-propanol (boiling point: 120.6° C.)
MA: Methanol (boiling point: 65.0° C.)
BL: γ-Butyrolactone (boiling point: 206° C.)

TABLE 8

| | Solvent type: amount (g) | Drying conditions Temperature (° C.) | Time (sec) | Residual solvent (% by weight) | Sensitivity ($mJ/cm^2$) | Sensitivity drop ($mJ/cm^2$) |
|---|---|---|---|---|---|---|
| Example 14 | MEK: 18 g | 110 | 60 | 1.9(MEK) | 180 | 20 |
| Example 15 | MEK: 18 g | 120 | 60 | 1.9(MEK) | 175 | 20 |
| Example 16 | MEK: 18 g | 140 | 60 | 1.6(MEK) | 180 | 15 |
| Example 17 | MEK: 11 g<br>MFG: 7 g | 130 | 60 | 4.7(MFG) | 170 | 25 |
| Example 18 | MEK: 11 g<br>MFG: 7 g | 130 | 90 | 4.2(MFG) | 170 | 20 |
| Example 19 | MEK: 11 g<br>MFG: 7 g | 110 | 60 | 2.3(MEK) | 165 | 20 |
| Example 20 | MEK: 11 g<br>MFG: 7 g | 120 | 60 | 2.0(MEK) | 170 | 20 |
| Example 21 | MEK: 9 g<br>MFG: 4.5 g<br>BL: 4.5 g | 150 | 90 | 4.4(BL) | 175 | 20 |
| Example 22 | MEK: 11 g<br>MFG: 7 g | 120<br>150 | 45<br>15 | 4.5(MFG) | 165 | 20 |
| Example 23 | MEK: 9 g<br>MFG: 4.5 g<br>BL: 4.5 g | 120<br>35° C.<br>15 mmHg | 60<br>30000 | 4.5(BL) | 165 | 25 |
| Comparative Example 5 | MEK: 11 g<br>MFG: 7 g | 110 | 60 | 7.5(MFG) | 175 | 45 |
| Comparative Example 6 | MEK: 11 g<br>MFG: 7 g | 120 | 60 | 6.3(MFG) | 175 | 40 |
| Comparative Example 7 | MEK: 9 g<br>MFG: 4.5 g<br>BL: 4.5 g | 120 | 60 | 11.3 | 160 | 60 |

[Evaluation of Performance of the Planographic Printing Plates]

Each of the planographic printing plates prepared above in Examples 14 to 23 and Comparative Examples 5 to 7 was measured for the amount of the residual solvent in the photosensitive layer by gas chromatography and then evaluated for its performance according to the criteria described below. Both the amount of the residual solvent and the evaluation results are shown in Table 8.

[Image Formability: Evaluation of Sensitivity]

The resulting planographic printing plate was exposed at a major scanning speed of 5 m/sec. by means of a semiconductor laser with a power output of 500 mW, a wavelength of 840 nm, a beam diameter of 17 μm ($1/e^2$) and then developed in an automatic developing machine (PS Processor 900VR, Fuji Photo Film Co., Ltd.) charged with a developing solution DP-4 (diluted at 1:8)) and a rinse FR-3 (1:7) produced by Fuji Photo Film Co., Ltd., and the line width of the resulting non-image portion was measured, and the exposure energy of the laser corresponding to the line width was determined and used as sensitivity.

[Evaluation of Storage Stability]

The resulting planographic printing plate was stored at room temperature (20 to 25° C.) for 60 days before laser exposure, and thereafter, it was subjected to laser exposure and development and then measured for its sensitivity in the same manner as described above, and the results were compared with those described above. A smaller change in sensitivity is evaluated to be indicative of better storage stability.

From the results in Table 8, it was confirmed that the planographic printing plates in Examples 14 to 23 where the amount of the residual solvent in the photosensitive layer is small are similar in sensitivity to the planographic printing plates in Comparative Examples 5 to 7 where the amount of the residual solvent is high, but the change in their sensitivity before and after storage is less and their storage stability is good. Further, it can be understood that even the photosensitive layer containing a high-boiling solvent can be applied to the present invention by changing the drying conditions, that is, by prolonging the drying time or conducting the drying step twice.

Example 24

[Preparation of a Support]

Support A used in Examples 14 to 23 was treated with 2.5% by weight aqueous sodium silicate at 30° C. for 10 seconds, and then coated with the following prime-coating solution 3, and the coating was dried at 80° C. for 15 seconds, whereby support C was obtained. The amount of the coating after drying was 15 $mg/m^2$.

| <Prime-coating solution 3> | |
|---|---|
| • The polymer below | 0.3 g |
| • Methanol | 100 g |
| • Water | 1 g |

-continued

<Prime-coating solution 3>

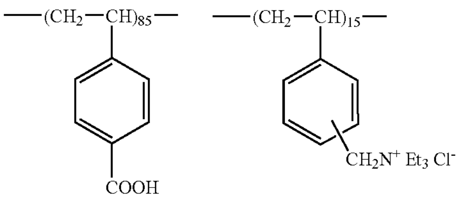

M.W. 28,000

The following photosensitive layer coating solution 5 was applied in an amount of 1.3 g/$m^2$ onto the resulting support C to give the planographic printing plate in Example 24. The photosensitive layer was dried by heating it at 150° C. for 110 seconds in the same oven as in Examples 14 to 23.

| <Composition of the photosensitive layer coating solution 5> | |
|---|---|
| m, p-Cresol novolak (with a m/p ratio = 6/4, a weight average molecular weight of 3500 and an unreacted cresol content of 0.5% by weight) | 0.3 g |
| Copolymer 1 described in the Examples in JP-A No. 11-348443 | 0.7 g |
| Bis(4-hydroxyphenyl) sulfone | 0.1 g |
| IR absorber (with the structure above) | 0.15 g |
| p-Toluene sulfonic acid | 0.002 g |
| Victoria Pure Blue wherein the counterion BOH was replaced by 1-naphthalene sulfonate anion | 0.02 g |
| Fluorine-type surfactant (Megafac F-177, Dainippon Ink and Chemicals, Inc.) | 0.05 g |
| γ-Butyrolactone | 8 g |
| Methyl ethyl ketone | 8 g |
| 1-Methoxy-2-propanol | 4 g |

Examples 25 to 26 and Comparative Example 8

The planographic printing plates in Examples 25 to 26 and Comparative Example 8 were formed in the same manner as in Example 24 except that the type of the solvent incorporated into the photosensitive layer coating solution 5 and the drying conditions after application of the photosensitive layer coating solution were changed as shown in Table 9.

TABLE 9

| | Solvent type: amount (g) | Drying conditions Temperature (° C.) | Time (sec) | Residual solvent (% by weight) | Sensitivity (mJ/$cm^2$) | Sensitivity drop (mJ/$cm^2$) |
|---|---|---|---|---|---|---|
| Example 24 | MEK: 9 g<br>MFG: 4.5 g<br>BL: 4.5 g | 150 | 110 | 4.7(BL) | 75 | 15 |
| Example 25 | MEK: 9 g<br>MFG: 4.5 g<br>BL: 4.5 g | 120<br>150 | 60<br>30 | 4.8(BL) | 75 | 20 |
| Example 26 | MEK: 9 g<br>MFG: 4.5 g<br>BL: 4.5 g | 120<br>35° C.<br>15 mmHg | 60<br>30000 | 4.5(BL) | 75 | 15 |
| Comparative Example 8 | MEK: 9 g<br>MFG: 4.5 g<br>BL: 4.5 g | 120 | 60 | 12.1 | 70 | 45 |

[Evaluation of Performance of the Planographic Printing Plates]

Each of the planographic printing plates prepared above in Examples 24 to 26 and Comparative Example 8 was measured for the amount of the residual solvent in the photosensitive layer by gas chromatography and then its performance was evaluated according to the criteria described below. Both the amount of the residual solvent and the evaluation results are shown in Table 9.

Each of the planographic printing plates in Examples 24 to 26 and Comparative Example 8 was exposed by means of a plate setter, Trendsetter 3244F (Cleo Ltd.) and developed by an automatic developing machine under the conditions described below. The exposure conditions were that the number of revolution was fixed at 150 rpm and the power output was changed gradually from 3 to 12 W. Under these conditions, the sensitivity was determined. The sensitivity was defined as the minimum energy necessary for completely dissolving the exposed portion during development. The evaluation results are shown in Table 9.

[Evaluation of Storage Stability]

The resulting planographic printing plate was stored at room temperature (20 to 25° C.) for 60 days before laser exposure, and thereafter, it was subjected to laser exposure and development and then measured for its sensitivity in the same manner as described above, and the results were compared with those described above. A smaller change in sensitivity is evaluated to be indicative of better storage stability.

[Development Treatment]

A first bath in a commercial automatic developing machine LP-900H (Fuji Photo Film Co., Ltd.) having dipping-type developing baths was fed with 20 L developing solution DT-4 (diluted at 1:8, Fuji Photo Film Co., Ltd.) and kept at a temperature of 30° C. A second bath was fed with 8 L tap water, and a third bath was fed with 8 L FP-2W finishing gum solution diluted at 1:1 (Fuji Photo Film Co., Ltd.). The respective planographic printing plates in Examples 24 to 26 and Comparative Example 8 were developed in this automatic developing machine.

From the results in Table 9, it was confirmed that the planographic printing plates in Examples 24 to 26 where the amount of the residual solvent in the photosensitive layer is small are similar in sensitivity to the planographic printing plate in Comparative Example 8 where the amount of the residual solvent is high, but the change in their sensitivity before and after storage is less, and their storage stability is good. Further, it is understood that even if such different photosensitive layers have been formed, the same effect as in Examples 14 to 23 can be achieved.

Examples 27 to 29 and Comparative Example 9

The planographic printing plates used in Examples 24 to 26 and Comparative Example 8 were exposed under the same conditions as in Example 24, then developed under the following conditions, and examined for their sensitivity and storage stability in the same manner as described above. The results are shown in Table 10.

[Development Treatment]

A first bath in a commercial automatic developing machine LP-900H (Fuji Photo Film Co., Ltd.) having dipping-type developing baths was fed with 20 L developing solution DT-4 (Fuji Photo Film Co., Ltd.) and kept at a temperature of 30° C. A second bath was fed with 8 L tap water, and a third bath was fed with 8 L FP-2W finishing gum solution diluted at 1:1 (Fuji Photo Film Co., Ltd.). The respective planographic printing plates in Examples 27 to 29 and Comparative Example 9 were developed in this automatic developing machine.

before and after storage is small, and their storage stability is good. Further, it is understood that even if such developing solutions of different concentrations are used for development, the same effect as in Examples 24 to 26 can be achieved.

According to the present invention, there can be provided a planographic printing plate capable of recording by heat-mode exposure, excellent in image-forming properties, and excellent in storage stability without lowering the image-forming properties even after long-term storage.

What is claimed is:

1. A process for producing a heat mode-compatible positive planographic printing plate precursor comprising a support and a photosensitive layer whose solubility in an aqueous alkali solution increases upon heat-mode exposure, comprising the steps of:

applying a photosensitive layer coating solution onto the support; and drying the photosensitive layer coating solution at a drying temperature not less than 150° C. and not greater than 200° C. and for a drying time of 20 to 110 seconds, wherein the photosensitive layer coating solution is obtained by dissolving or dispersing a photosensitive composition in a solvent;

the photosensitive composition contains a polymer insoluble in water but soluble in an aqueous alkali solution;

the solvent comprises a low-boiling solvent with a boiling point of 130° C. or less and a high-boiling solvent with a boiling point of greater than 130° C.; and the residual solvent in the photosensitive layer is 5% by weight or less relative to the weight of the photosensitive layer.

2. The process of claim 1, wherein the residual solvent in the photosensitive layer is 4% by weight or less relative to the weight of the photosensitive layer.

3. The process of claim 1, wherein the polymer insoluble in water but soluble in an aqueous alkali solution has sulfonamide groups or active imide groups on the main chain or side chains thereof as acidic groups.

4. The process of claim 1, wherein the solvent is at least one selected from the group consisting of methanol, ethanol, isopropanol, dioxolane, 1-methoxy-2-propanol, ethylacetate, and γ-butyrolactone.

TABLE 10

| | Solvent type: amount (g) | Drying conditions Temperature (° C.) | Time (sec) | Residual solvent (% by weight) | Sensitivity ($mJ/cm^2$) | Sensitivity drop ($mJ/cm^2$) |
|---|---|---|---|---|---|---|
| Example 27 | MEK: 9 g<br>MFG: 4.5 g<br>BL: 4.5 g | 150 | 110 | 4.7(BL) | 80 | 15 |
| Example 28 | MEK: 9 g<br>MFG: 4.5 g<br>BL: 4.5 g | 120<br>150 | 60<br>30 | 4.8(BL) | 75 | 15 |
| Example 29 | MEK: 9 g<br>MFG: 4.5 g<br>BL: 4.5 g | 120<br>35° C.<br>15 mmHg | 60<br>30000 | 4.5(BL) | 80 | 10 |
| Comparative Example 9 | MEK: 9 g<br>MFG: 4.5 g<br>BL: 4.5 g | 120 | 60 | 12.1 | 75 | 50 |

From the results in Table 10, it was confirmed that the planographic printing plates in Examples 27 to 29 where the amount of the residual solvent in the photosensitive layer is small are similar in sensitivity to the planographic printing plate in Comparative Example 9 where the amount of the residual solvent is high, but the change in their sensitivity 5. The process of claim 1, wherein the polymer insoluble in water but soluble in an aqueous alkali solution is mainly constituted by at least one monomer selected from those represented by following formulae (1) to (5):

Formula (1)

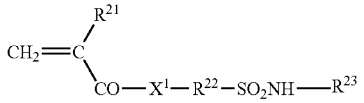

Formula (2)

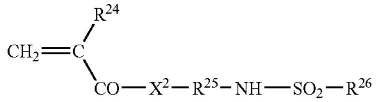

Formula (3)

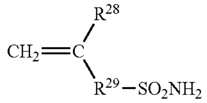

Formula (4)

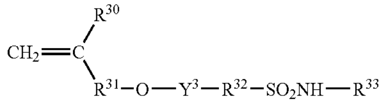

Formula (5)

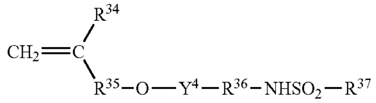

wherein $X^1$ and $X^2$ each represents —O— or —$NR^{27}$; $R^{21}$ and $R^{24}$ each represents a hydrogen atom or —$CH_3$; $R^{22}$, $R^{25}$, $R^{29}$, $R^{32}$ and $R^{36}$ each represents an alkylene group having 1 to 12 carbon atoms, cycloalkylene group, arylene group or aralkylene group which may have a substituent group; $R^{23}$, $R^{27}$ and $R^{33}$ each represents a hydrogen atom, an alkyl group having 1 to 12 carbon atoms, cycloalkyl group, aryl group or aralkyl group which may have a substituent group; $R^{26}$ and $R^{37}$ each represent an alkyl group having 1 to 12 carbon atoms, cycloalkyl group, aryl group, or aralkyl group which may have a substituent group; $R^{28}$, $R^{30}$, and $R^{34}$ represent a hydrogen atom or —$CH_3$; $R^{31}$ and $R^{35}$ each represents an alkylene group having 1 to 12 carbon atoms, cycloalkylene group, arylene group or aralkylene group which may have a single bond or a substituent group; and $Y^3$ and $Y^4$ each represents a single bond or —CO—.

6. The process of claim 1, wherein the polymer insoluble in water but soluble in an aqueous alkali solution has active imide groups represented by the following formula on the main chain or side chains thereof as acidic groups:

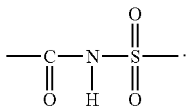

7. The process of claim 1, wherein the polymer insoluble in water but soluble in an aqueous alkali solution is mainly constituted by N-(p-aminosulfonyl phenyl)methacrylamide or N-(p-aminosulfonyl phenyl)acrylamide.

8. A process for producing a heat mode-compatible positive planographic printing plate precursor comprising a support and a photosensitive layer whose solubility in an aqueous alkali solution increases upon heat-mode exposure, comprising the steps of:

applying a photosensitive layer coating solution onto the support; and drying the photosensitive layer coating solution for 10 to 120 seconds under a temperature condition of 90 to 140° C., and further drying the photosensitive layer coating solution at a reduced pressure of 30 mmHg or less, wherein the photosensitive layer coating solution is obtained by dissolving or dispersing a photosensitive composition in a solvent;

the photosensitive composition contains a polymer insoluble in water but soluble in an aqueous alkali solution; and the residual solvent in the photosensitive layer is 5% by weight or less relative to the weight of the photosensitive layer.

9. The process of claim 8, wherein the residual solvent in the photosensitive layer is 4% by weight or less relative to the weight of the photosensitive layer.

10. The process of claim 8, wherein the polymer insoluble in water but soluble in an aqueous alkali solution has sulfonamide groups or active imide groups on the main chain or side chains thereof as acidic groups.

11. The process of claim 8, wherein the solvent is at least one selected from the group consisting of methanol, ethanol, isopropanol, dioxolane, 1-methoxy-2-propanol, ethylacetate, and γ-butyrolactone.

12. The process of claim 8, wherein the polymer insoluble in water but soluble in an aqueous alkali solution is mainly constituted by at least one monomer selected from those represented by following formulae (1) to (5):

Formula (1)

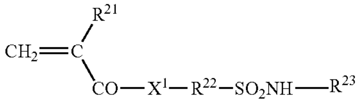

Formula (2)

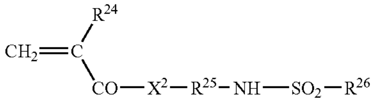

Formula (3)

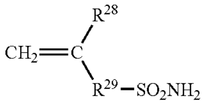

Formula (4)

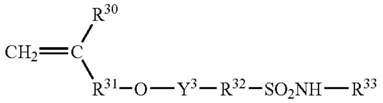

Formula (5)

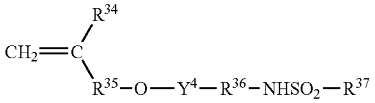

wherein $X^1$ and $X^2$ each represents —O— or —$NR^{27}$; $R^{21}$ and $R^{24}$ each represents a hydrogen atom or —$CH_3$; $R^{22}$, $R^{25}$, $R^{29}$, $R^{32}$ and $R^{36}$ each represents an alkylene group having 1 to 12 carbon atoms, cycloalkylene group, arylene group or aralkylene group which may have a substituent group; $R^{23}$, $R^{27}$ and $R^{33}$ each represents a hydrogen atom, an alkyl group having 1 to 12 carbon atoms, cycloalkyl group, aryl group or aralkyl group which may have a substituent group; $R^{26}$ and $R^{37}$ each represent an alkyl group having 1 to 12 carbon atoms, cycloalkyl group, aryl group, or aralkyl group which may have a substituent group; $R^{28}$, $R^{30}$, and $R^{34}$ represent a hydrogen atom or —$CH^3$; $R^{31}$ and $R^{35}$ each represents an alkylene group having 1 to 12 carbon atoms, cycloalkylene group, arylene group or aralkylene group which may have a single bond or a substituent group; and $Y^3$ and $Y^4$ each represents a single bond or —CO—.

13. The process of claim 8, wherein the polymer insoluble in water but soluble in an aqueous alkali solution has active imide groups represented by following formula on the main chain or side chains thereof as acidic groups:

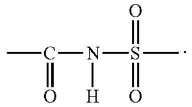

14. The process of claim 8, wherein the polymer insoluble in water but soluble in an aqueous alkali solution is mainly constituted by N-(p-aminosulfonyl phenyl)methacrylamide or N-(p-aminosulfonyl phenyl)acrylamide storage.

* * * * *